(12) United States Patent
Yamaoka et al.

(10) Patent No.: US 12,507,515 B2
(45) Date of Patent: Dec. 23, 2025

(54) LIGHT-EMITTING MODULE AND METHOD OF MANUFACTURING LIGHT-EMITTING MODULE

(71) Applicant: NICHIA CORPORATION, Anan (JP)

(72) Inventors: Kensuke Yamaoka, Tokushima (JP); Kenji Ozeki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 666 days.

(21) Appl. No.: 17/557,235

(22) Filed: Dec. 21, 2021

(65) Prior Publication Data

US 2022/0209079 A1 Jun. 30, 2022

(30) Foreign Application Priority Data

Dec. 25, 2020 (JP) .................................. 2020-217294
Aug. 4, 2021 (JP) .................................. 2021-128136

(51) Int. Cl.
    *H10H 20/856* (2025.01)
    *H10H 20/01* (2025.01)
    (Continued)

(52) U.S. Cl.
    CPC .......... *H10H 20/856* (2025.01); *H10H 20/01* (2025.01); *H10H 20/0362* (2025.01);
    (Continued)

(58) Field of Classification Search
    CPC ..... H01L 33/52; H01L 23/31; H01L 23/3157; H01L 23/3171; H01L 23/3185;
    (Continued)

(56) References Cited

U.S. PATENT DOCUMENTS 5,219,712 A * 6/1993 Evans .................... B29C 70/70
    430/311
5,962,810 A * 10/1999 Glenn .................... H10F 77/50
    174/532

(Continued)

FOREIGN PATENT DOCUMENTS

JP      2006-303482 A      11/2006
JP      2008-047665 A      2/2008

(Continued)

*Primary Examiner* — David A Zarneke
(74) *Attorney, Agent, or Firm* — Foley & Lardner LLP

(57) ABSTRACT

A light-emitting module includes: a plurality of light-emitting elements; a first substrate having an upper surface that includes an element mounting region on which the light-emitting elements are mounted, the first substrate including a plurality of first terminals; a second substrate having an upper surface that includes a substrate mounting region on which the first substrate is mounted, the second substrate including a plurality of second terminals; a plurality of wires each connected to corresponding ones of the first terminals and the second terminals; a light-shielding covering member disposed outward of the element mounting region so as to cover the plurality of wires; and a light-transmissive first projection disposed along the element mounting region between the element mounting region and the first terminals so as to be in contact with the covering member.

16 Claims, 21 Drawing Sheets

(51) Int. Cl.
*H10H 20/851* (2025.01)
*H10H 20/852* (2025.01)
*H10H 20/857* (2025.01)
*H10H 29/01* (2025.01)
*H10H 29/852* (2025.01)
*H10H 29/853* (2025.01)

(52) U.S. Cl.
CPC ........ *H10H 20/851* (2025.01); *H10H 20/852* (2025.01); *H10H 20/857* (2025.01); *H10H 29/0362* (2025.01); *H10H 29/852* (2025.01); *H10H 29/853* (2025.01); *H10H 20/036* (2025.01)

(58) Field of Classification Search
CPC ... H01L 23/041; H01L 23/043; H01L 23/055; H01L 23/057; H10H 20/8502; H10H 20/8504; H10H 20/8506; H10H 20/8508; H10H 20/84; H10H 20/852; H10H 20/853; H10H 29/852; H10H 29/853; H10H 20/0362; H10H 29/0362; H10F 77/50
See application file for complete search history.

(56) References Cited

U.S. PATENT DOCUMENTS

| | | | | |
|---|---|---|---|---|
| 6,246,566 | B1 * | 6/2001 | Glenn | H05K 9/0067 206/719 |
| 6,566,745 | B1 * | 5/2003 | Beyne | H01L 27/14618 257/784 |
| 6,674,159 | B1 * | 1/2004 | Peterson | H01L 27/14618 257/434 |
| 6,707,166 | B1 * | 3/2004 | Noguchi | H01L 23/24 257/790 |
| 6,825,551 | B1 * | 11/2004 | Do Bento Vieira | H01L 23/3107 257/666 |
| 7,199,438 | B2 * | 4/2007 | Appelt | H10F 77/407 257/E31.127 |
| 7,936,033 | B2 * | 5/2011 | Haskett | B81B 7/007 257/E23.128 |
| 8,373,177 | B2 * | 2/2013 | Kotani | H01L 25/0753 257/E21.627 |
| 8,629,469 | B2 * | 1/2014 | Schweighart | H10H 20/8506 438/27 |
| 9,293,670 | B2 * | 3/2016 | Toita | H10H 20/854 |
| 10,032,968 | B2 * | 7/2018 | Suzuki | H10H 20/852 |
| 11,276,806 | B2 * | 3/2022 | Chiang | H10H 20/853 |
| 11,373,991 | B2 * | 6/2022 | Hin | H01L 33/56 |
| 2009/0053850 | A1 | 2/2009 | Nishida et al. | |
| 2009/0127690 | A1 * | 5/2009 | Jaducana | B81C 1/00333 257/690 |
| 2011/0084299 | A1 | 4/2011 | Kotani et al. | |
| 2019/0206752 | A1 * | 7/2019 | Bautista, Jr. | H01L 21/4825 |
| 2019/0211986 | A1 * | 7/2019 | Tokida | H10H 20/80 |
| 2021/0320232 | A1 * | 10/2021 | Tangring | H10H 20/856 |
| 2024/0429350 | A1 * | 12/2024 | Zitzlsperger | H10H 20/855 |

FOREIGN PATENT DOCUMENTS

| | | | | |
|---|---|---|---|---|
| JP | 2011-086678 A | | 4/2011 | |
| JP | 2011-181754 A | | 9/2011 | |
| JP | 2016127145 A | * | 7/2016 | |
| JP | 2017-212301 | * | 11/2017 | ........ H01L 31/0203 |
| JP | 2017-212301 A | | 11/2017 | |
| JP | 2018-195658 A | | 12/2018 | |
| JP | 2021-009898 A | | 1/2021 | |
| WO | WO-2007012992 A1 | * | 2/2007 | ........ B81C 1/00333 |
| WO | WO-2018/051897 A1 | | 3/2018 | |

\* cited by examiner

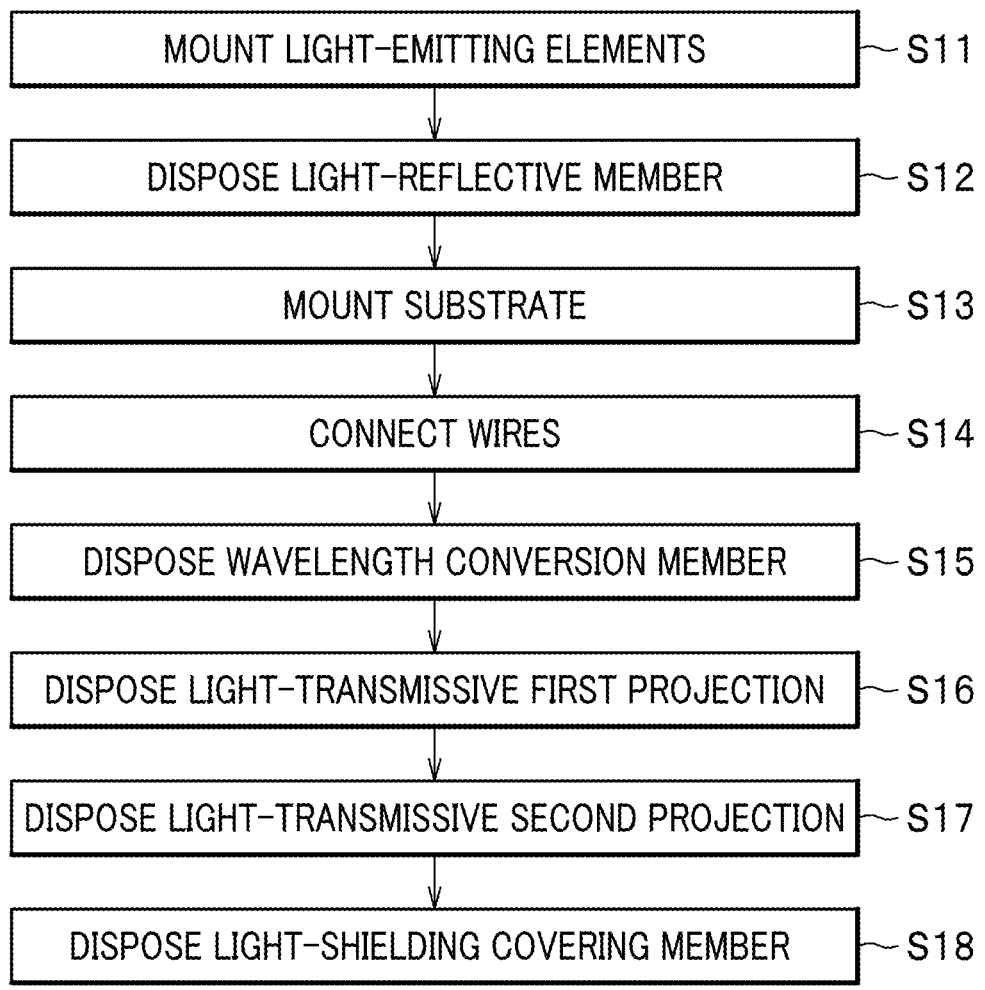

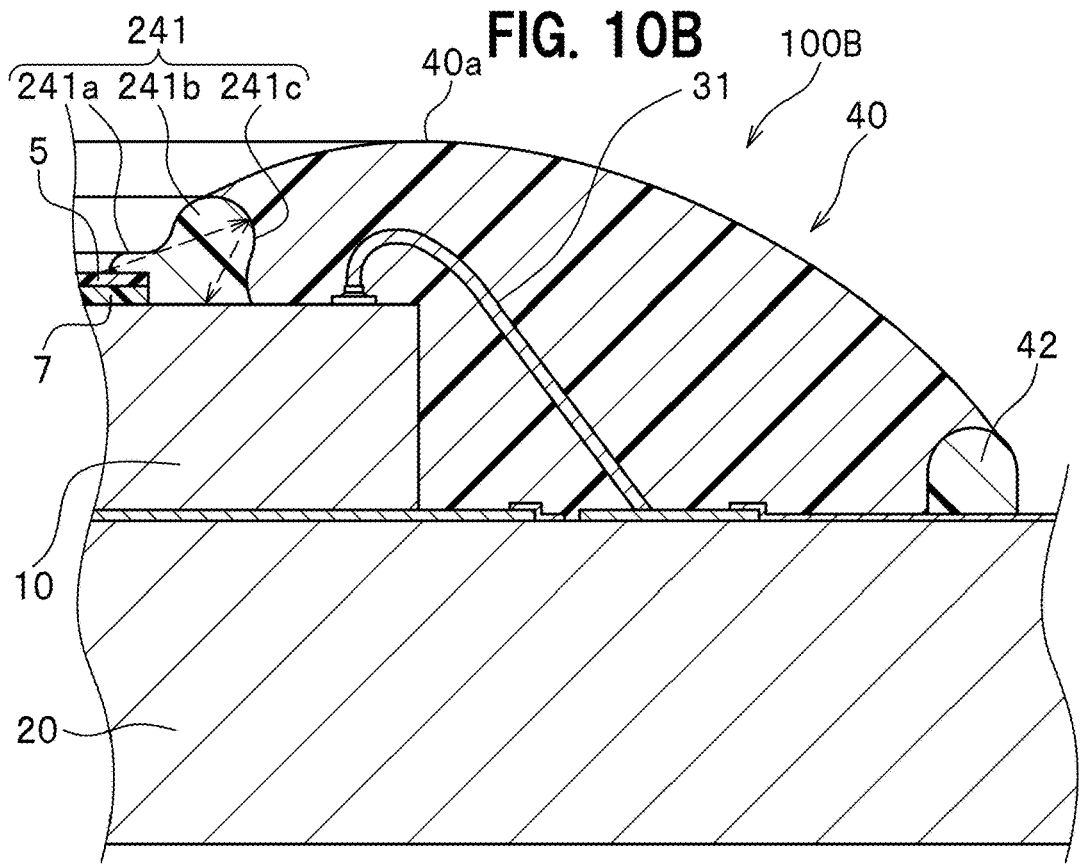
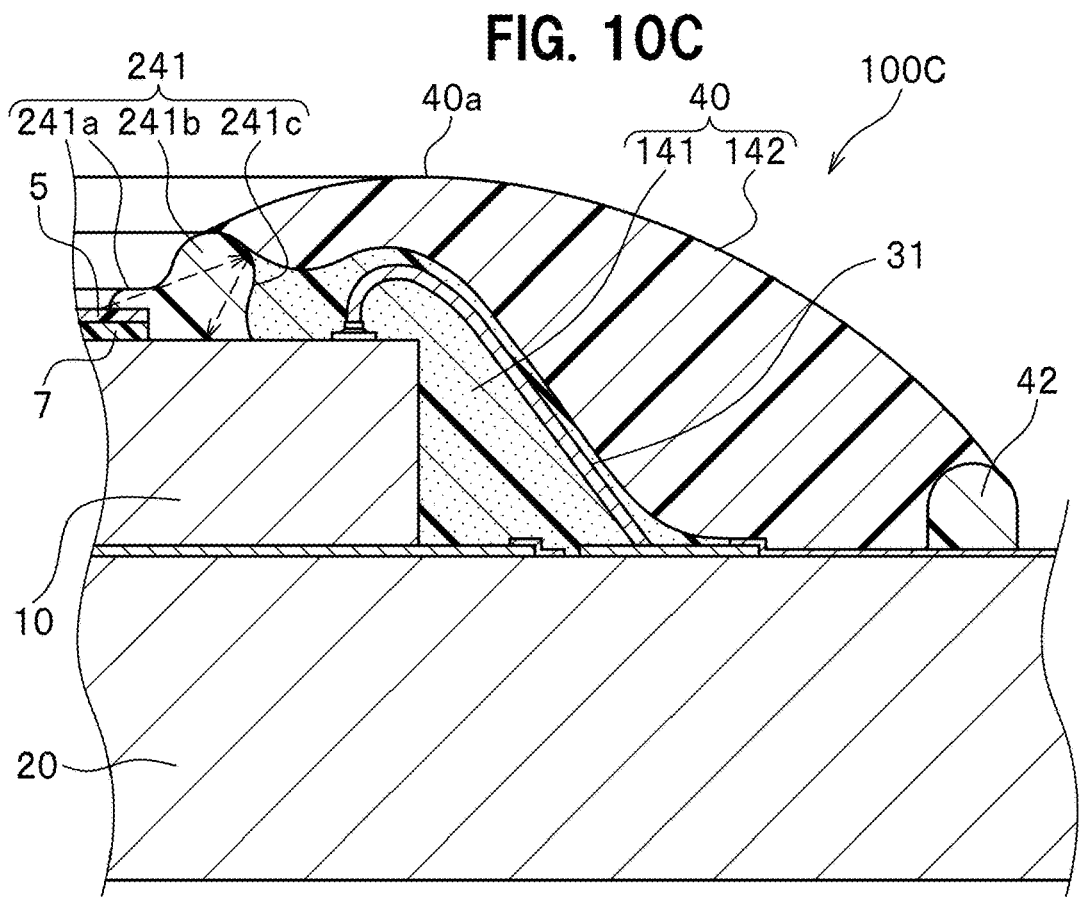

LIGHT-EMITTING MODULE AND METHOD OF MANUFACTURING LIGHT-EMITTING MODULE

CROSS-REFERENCE TO RELATED APPLICATIONS

This application claims priority to Japanese Patent Application No. 2020-217294, filed on Dec. 25, 2020, and Japanese Patent Application No. 2021-128136, filed on Aug. 4, 2021. The disclosures of these applications are hereby incorporated by reference in their entireties.

BACKGROUND

The present disclosure relates to a light-emitting module and a method of manufacturing a light-emitting module.

Light-emitting modules each including a plurality of light-emitting elements have been used as light sources for vehicles or light sources for projectors. When a light-emitting module is used as a light source, for example, a structure is employed in which light is emitted from the light source to the outside through a lens. Known examples of such a light-emitting module include a structure in which a plurality of light-emitting elements are arranged on a submount, the submount is mounted on a wiring board, and the submount is connected to the wiring board via wires (see, for example, Japanese Patent Publication No. 2017-212301).

SUMMARY

An object of certain embodiments of the present disclosure is to provide a highly reliable light-emitting module in which scattering of light emitted from light sources is reduced and a method of manufacturing the light-emitting module.

A light-emitting module according to an embodiment of the present disclosure includes: a plurality of light-emitting elements; a first substrate having an upper surface that includes an element mounting region on which the plurality of light-emitting elements are mounted, the first substrate comprising a plurality of first terminals arranged along the element mounting region at locations outward of the element mounting region on the upper surface of the first substrate; a second substrate having an upper surface that includes a substrate mounting region on which the first substrate is mounted, the second substrate comprising a plurality of second terminals arranged along the substrate mounting region at locations outward of the substrate mounting region on the upper surface of the second substrate; a plurality of wires each connected to a corresponding one of the first terminals and a corresponding one of the second terminals, the plurality of wires arranged along corresponding outer edges of the first substrate; a light-shielding covering member disposed outward of the element mounting region to cover the plurality of wires; and a light-transmissive first projection disposed along the element mounting region between the element mounting region and the first terminals to be in contact with the covering member.

A method of manufacturing a light-emitting module according to an embodiment of the present disclosure includes: mounting a plurality of light-emitting elements in an element mounting region of a first substrate; mounting the first substrate in a substrate mounting region of a second substrate; connecting respective ones of a plurality of first terminals disposed outward of the element mounting region of the first substrate and respective ones of a plurality of second terminals disposed outward of the substrate mounting region of the second substrate via respective wires; disposing a light-transmissive first projection along the element mounting region between the element mounting region and the first terminals; and disposing a light-shielding covering member outward of the first projection to be in contact with the first projection and to cover the wires.

According to certain embodiments of the present disclosure, a light-emitting module with high reliability and reduction in scattered light, and a method of manufacturing the light-emitting module may be provided.

BRIEF DESCRIPTION OF THE DRAWINGS

FIG. 8 is a flowchart illustrating a method of manufacturing the light-emitting module according to the embodiment.

FIG. 10B is a schematic cross-sectional view of a second variation of the embodiment.

FIG. 10C is a schematic cross-sectional view of a third variation of the embodiment.

DETAILED DESCRIPTION

Figure 1:
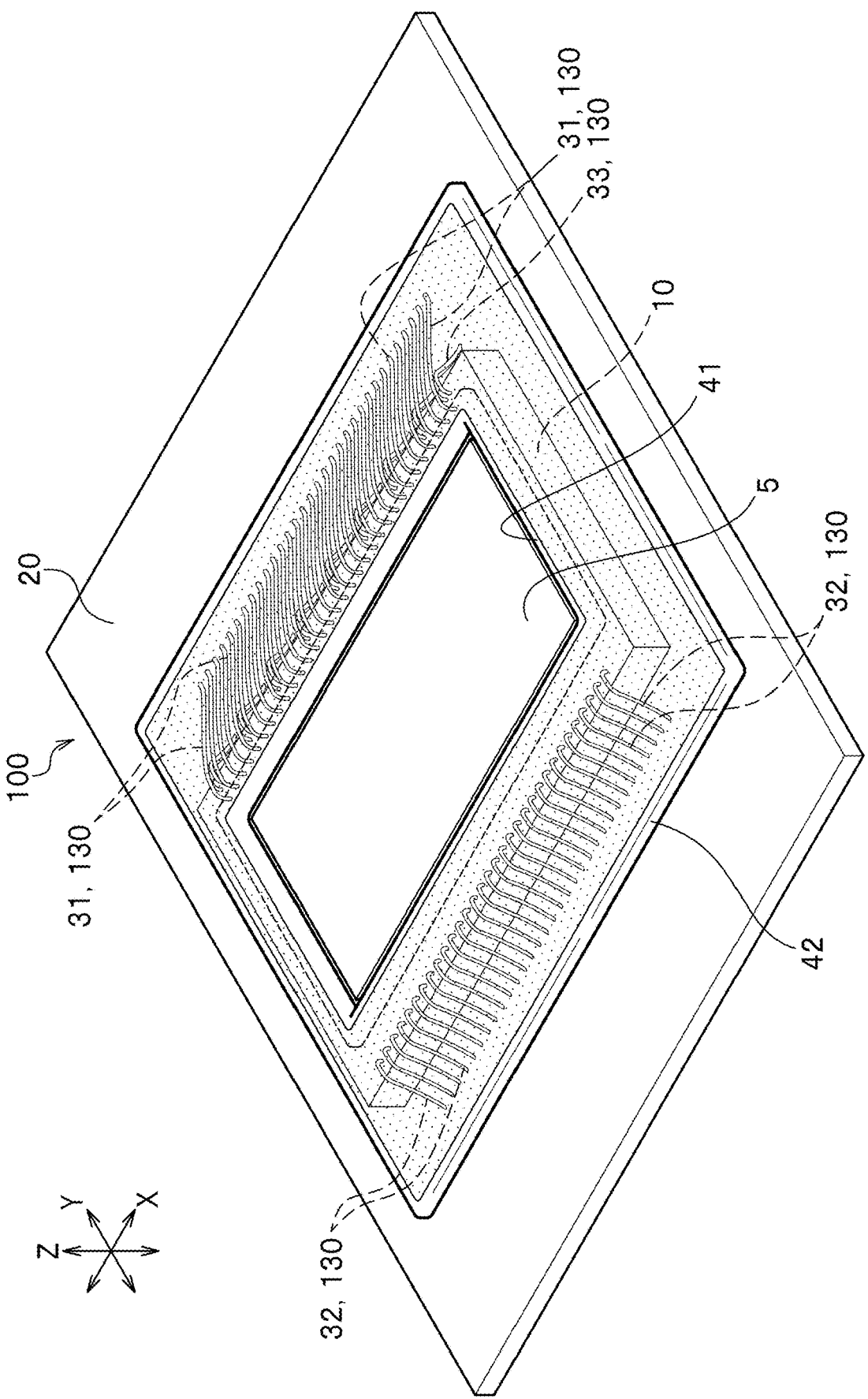
FIG. 1 is a schematic perspective view of a light-emitting module according to one embodiment.

A light-emitting module according to certain embodiments will be described below referring to the accompanying drawings. Sizes or positional relationships of components illustrated in the drawings may be exaggerated in order to clarify the descriptions. Dimensions or positions of each member in a plan view and the corresponding cross-sectional view may not be strictly consistent. The illustration of components may be partly omitted to prevent the drawings from being excessively complicated, and end views showing only cross sections of members may be used as cross-sectional views. Further, in the descriptions below, up, down, right, left, forward, and backward directions do not indicate absolute directions, but rather indicate relative directions. The same designation or reference numeral generally represents the same member or a member made of the same or a similar material, and the detailed description thereof may be omitted when appropriate. The terms "covering" and "cover" as used in the embodiments include not only being in direct contact, but rather also include indirect covering, such as covering via another member disposed therebetween. The term "plan view" as used in the present specification refers to observation from above the light extracting surface of the light-emitting module.

First Embodiment

Structure of Light-Emitting Module

The structure of a light-emitting module according to an embodiment is described referring to FIG. 1 to FIG. 7.

Figure 2:
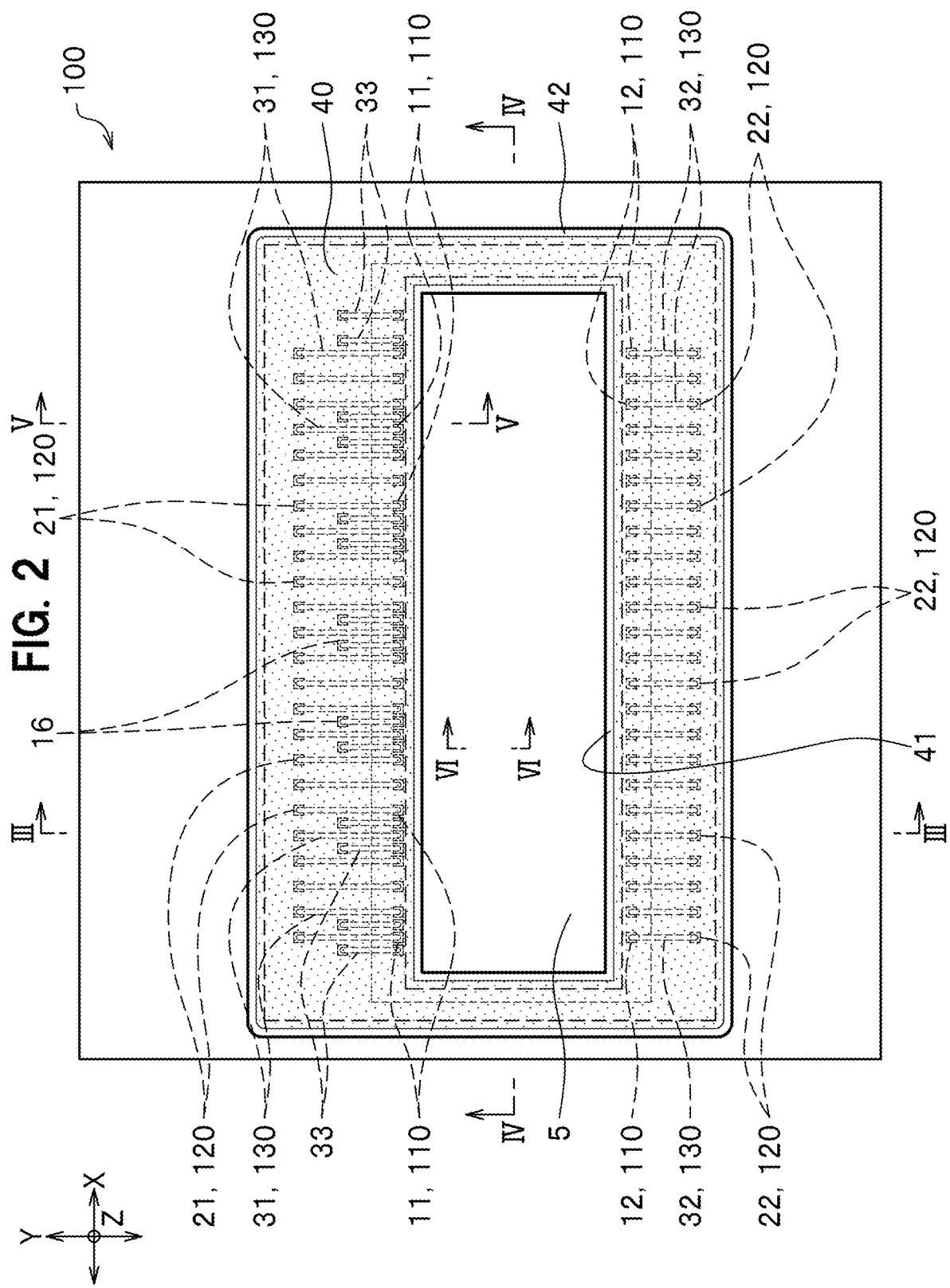
FIG. 2 is a schematic plan view of the light-emitting module according to the embodiment.
Figure 3:
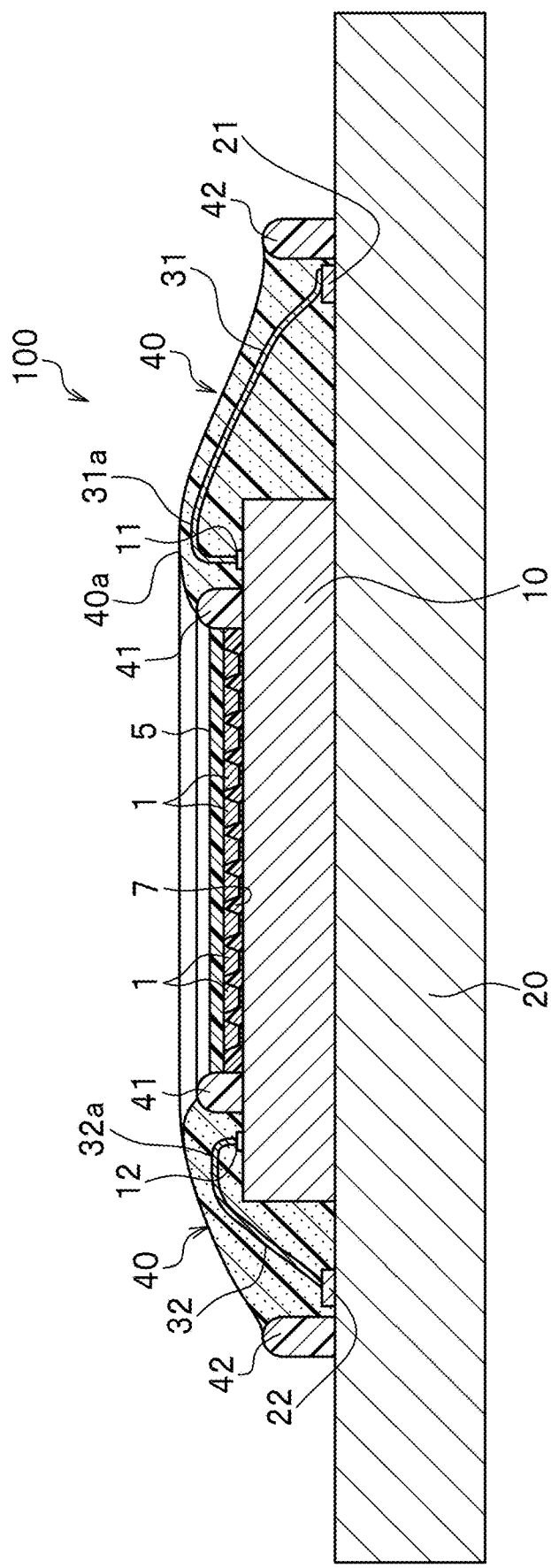
FIG. 3 is a schematic cross-sectional view taken along the line III-III of FIG. 2.
Figure 4:
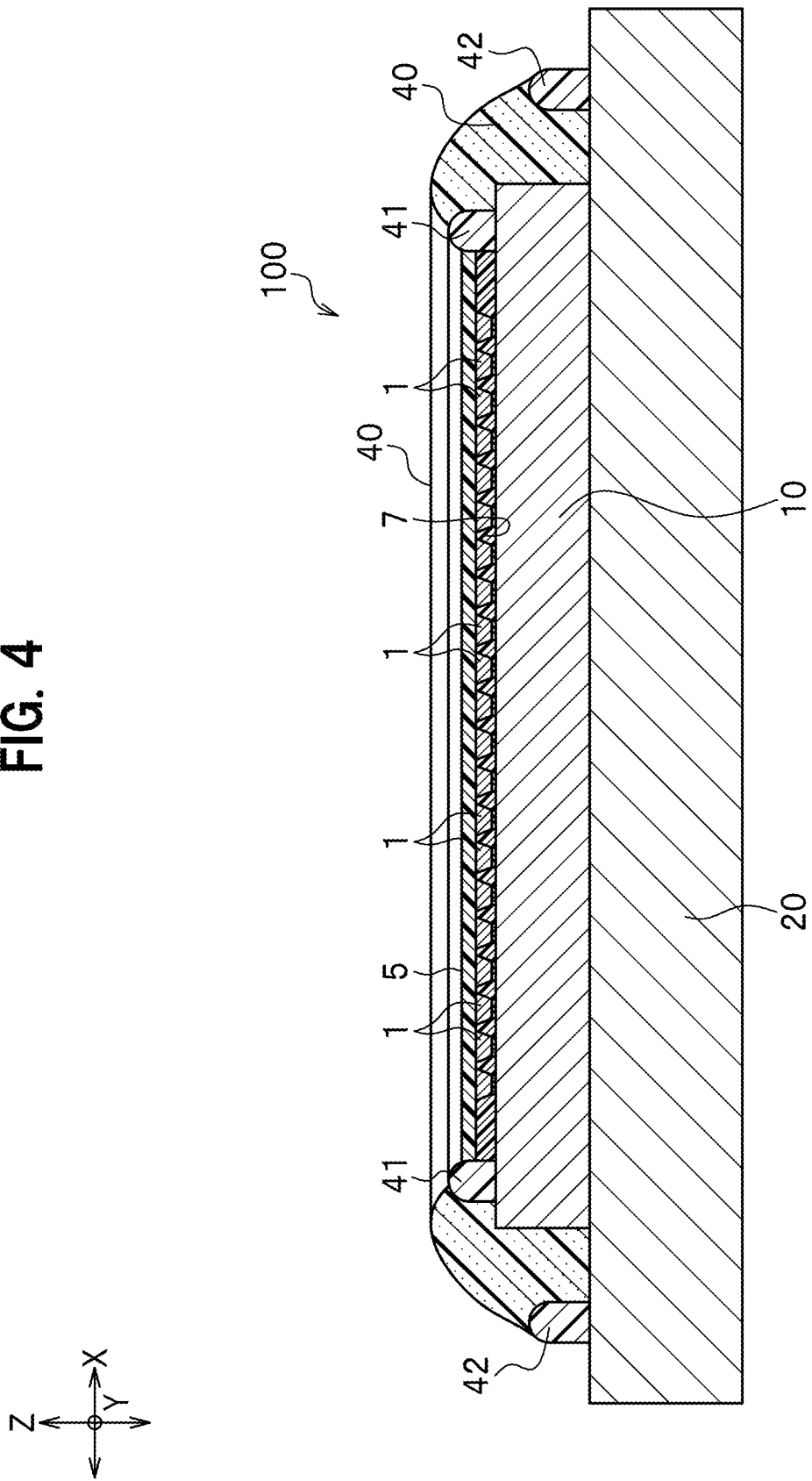
FIG. 4 is a schematic cross-sectional view of a portion on the line IV-IV of FIG. 2.
Figure 5:
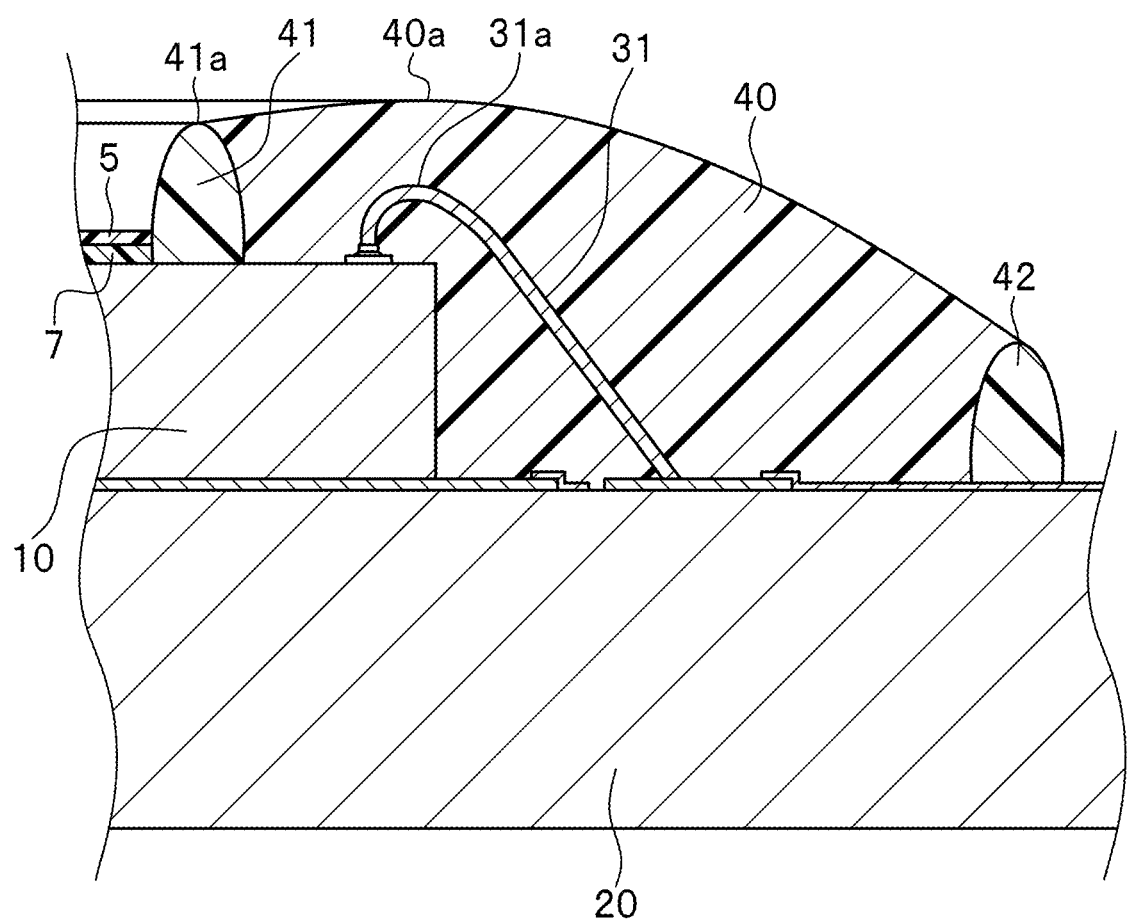
FIG. 5 is a schematic cross-sectional view taken along the line V-V of FIG. 2.
Figure 6:
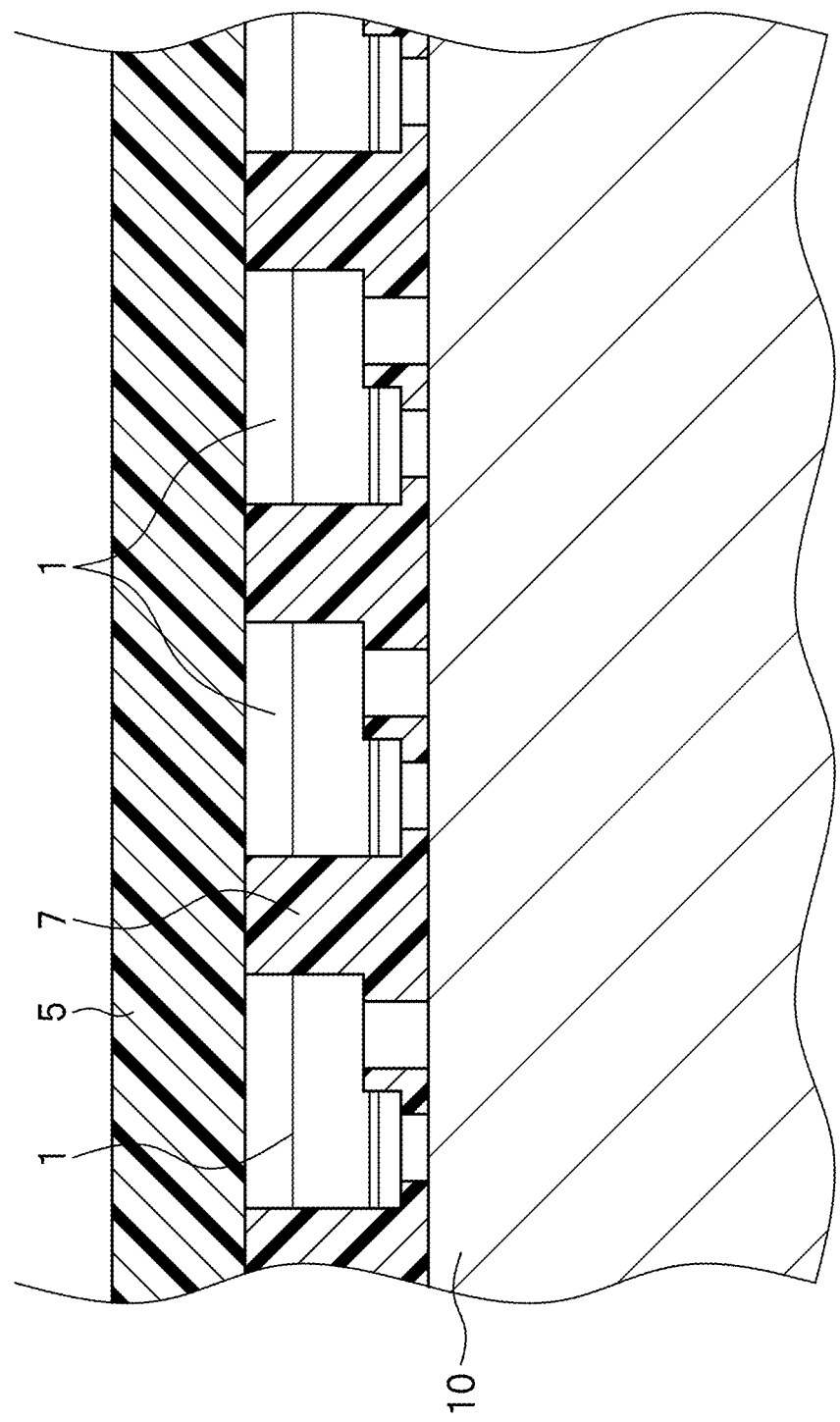
FIG. 6 is a schematic cross-sectional view taken along the line VI-VI of FIG. 2.
Figure 7:
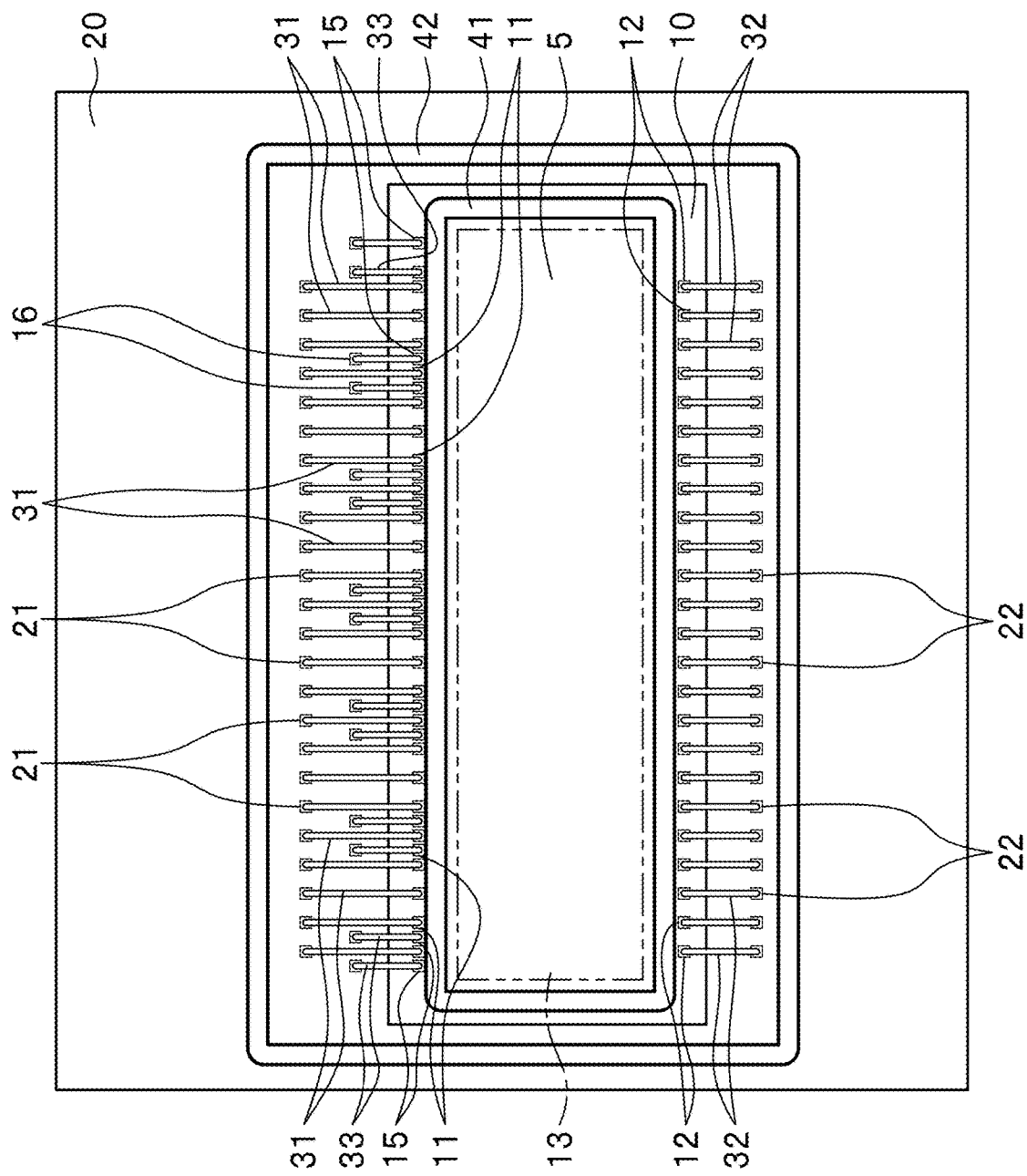
FIG. 7 is a schematic plan view of first and second projections and wires in the light-emitting module according to the embodiment.
Figure 9A:
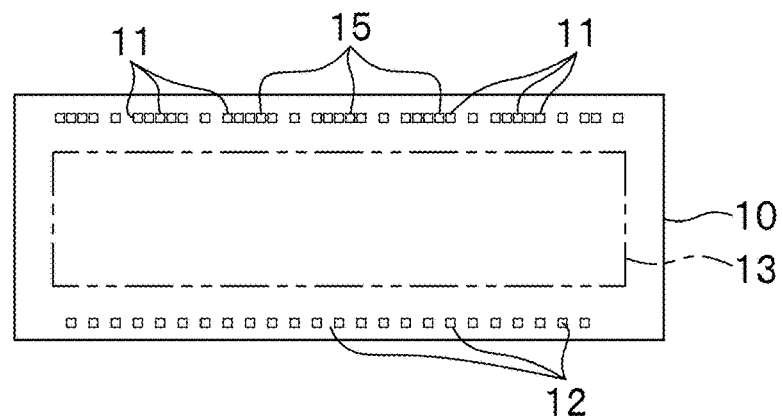
FIG. 9A is a schematic plan view illustrating the method of manufacturing the light-emitting module according to the embodiment.
Figure 9B:
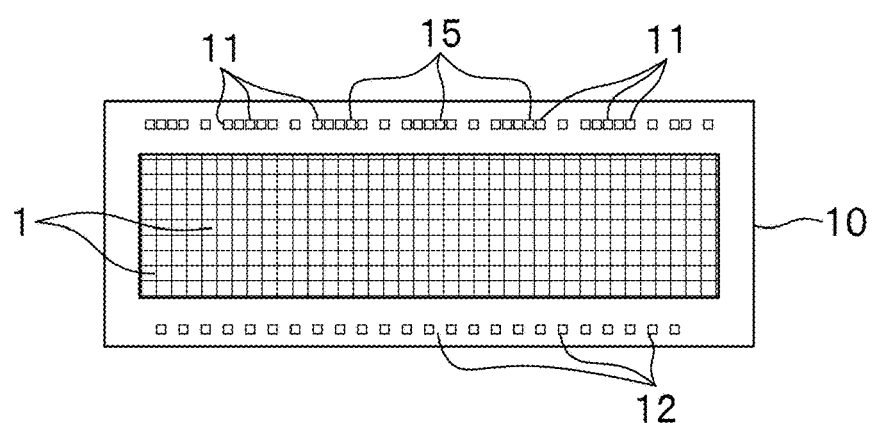
FIG. 9B is a schematic plan view illustrating the method of manufacturing the light-emitting module according to the embodiment.
Figure 9C:
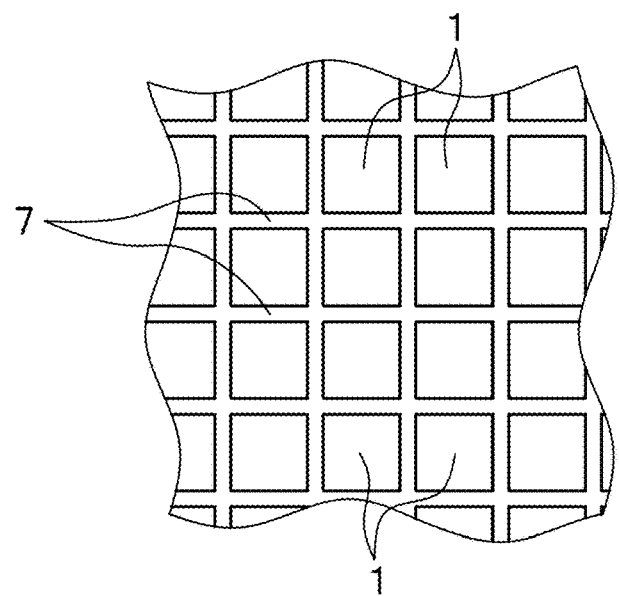
FIG. 9C is a schematic enlarged plan view illustrating the method of manufacturing the light-emitting module according to the embodiment.
Figure 9D:
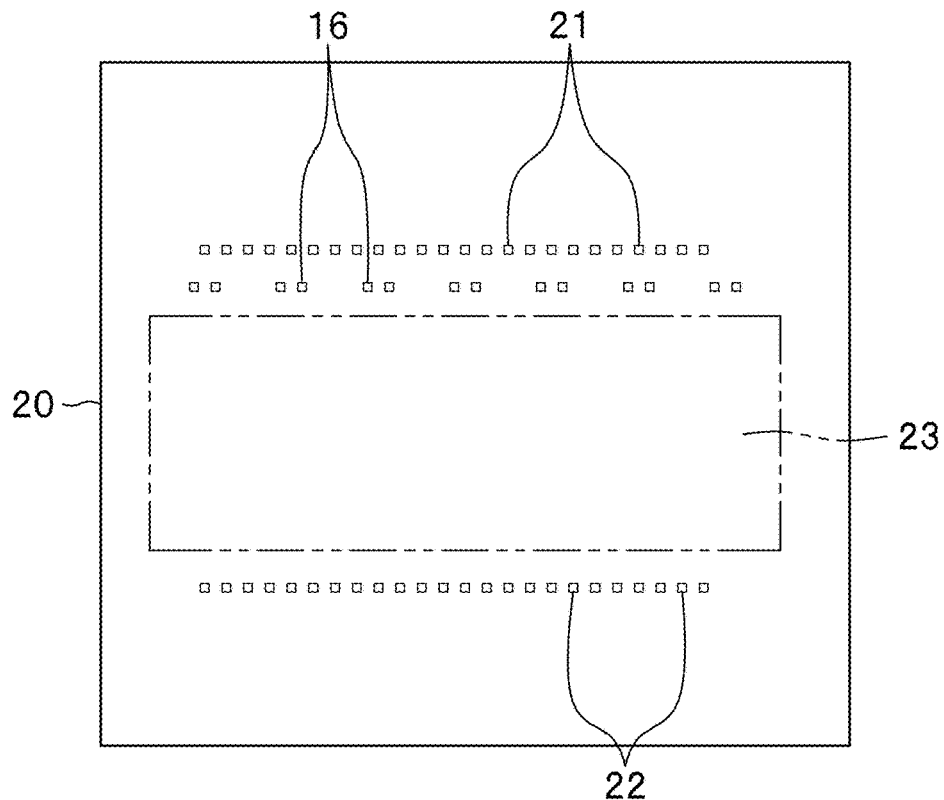
FIG. 9D is a schematic plan view illustrating the method of manufacturing the light-emitting module according to the embodiment.
Figure 9E:
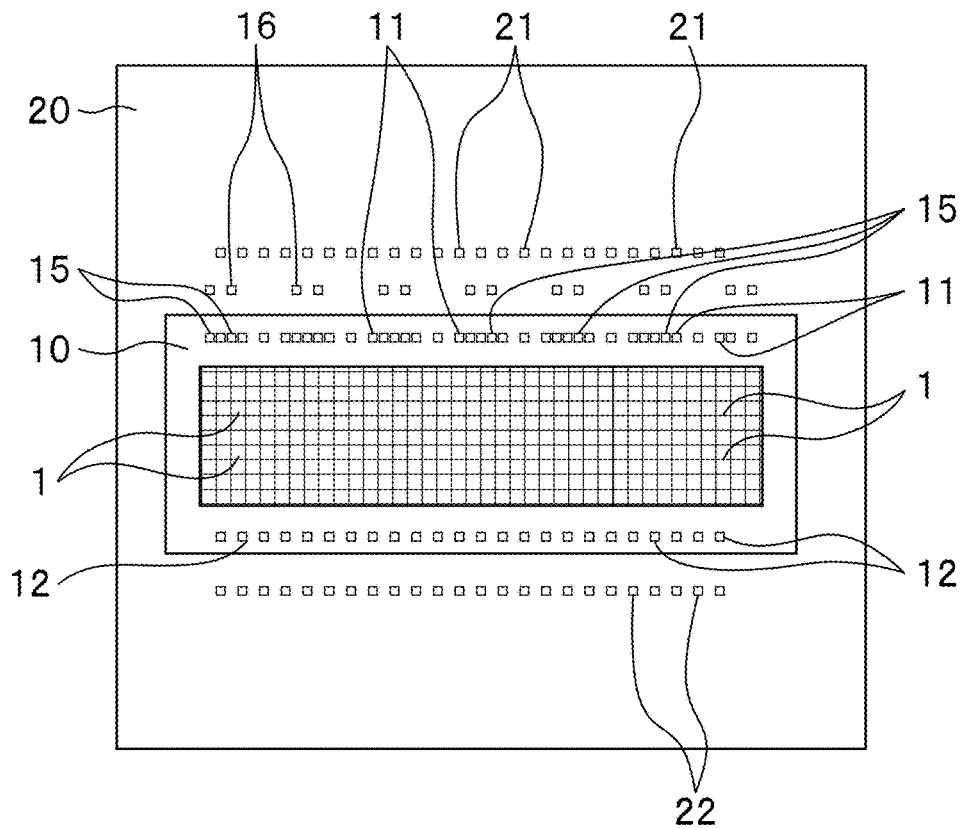
FIG. 9E is a schematic plan view illustrating the method of manufacturing the light-emitting module according to the embodiment.
Figure 9F:
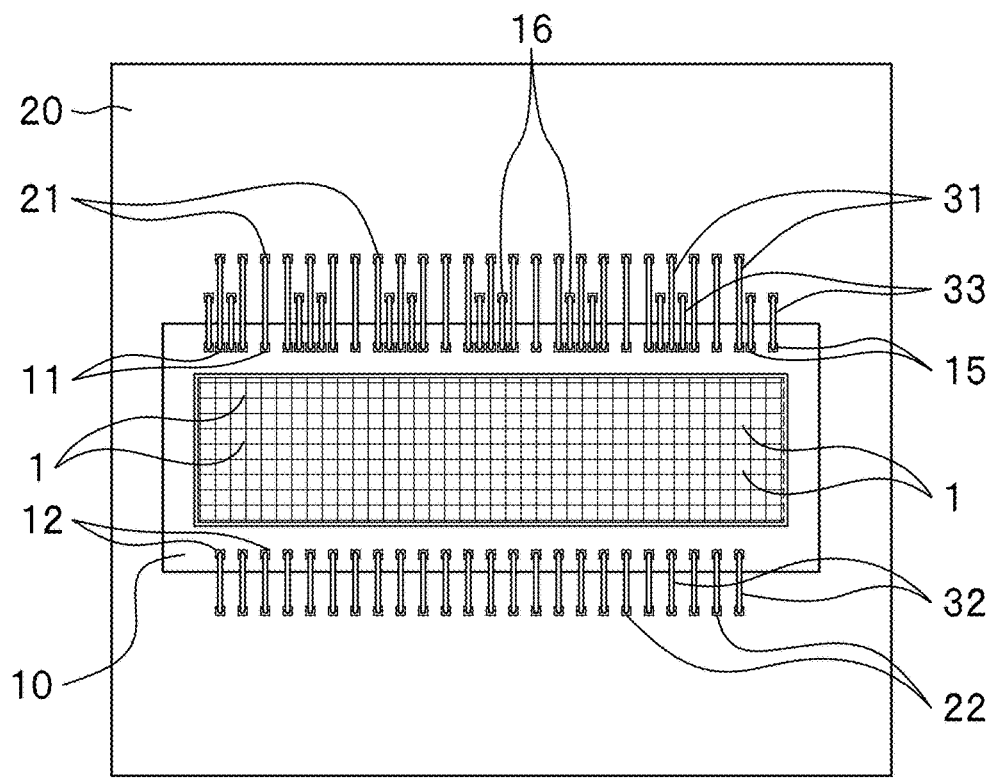
FIG. 9F is a schematic plan view illustrating the method of manufacturing the light-emitting module according to the embodiment.
Figure 9G:
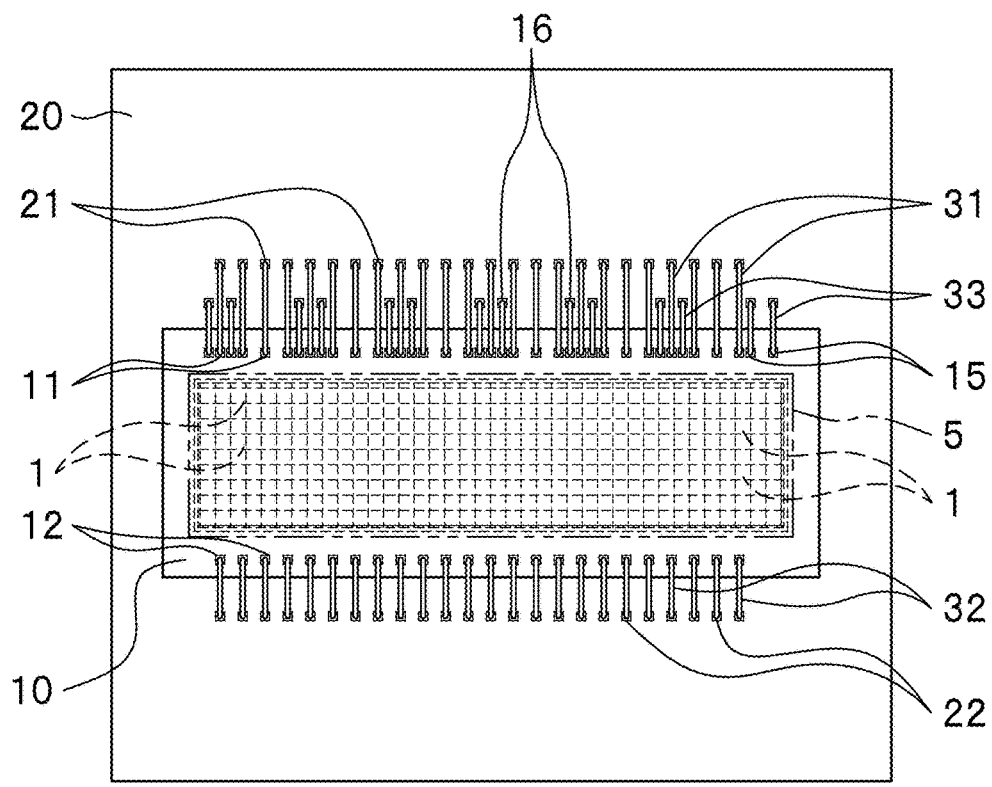
FIG. 9G is a schematic plan view illustrating the method of manufacturing the light-emitting module according to the embodiment.
Figure 9H:
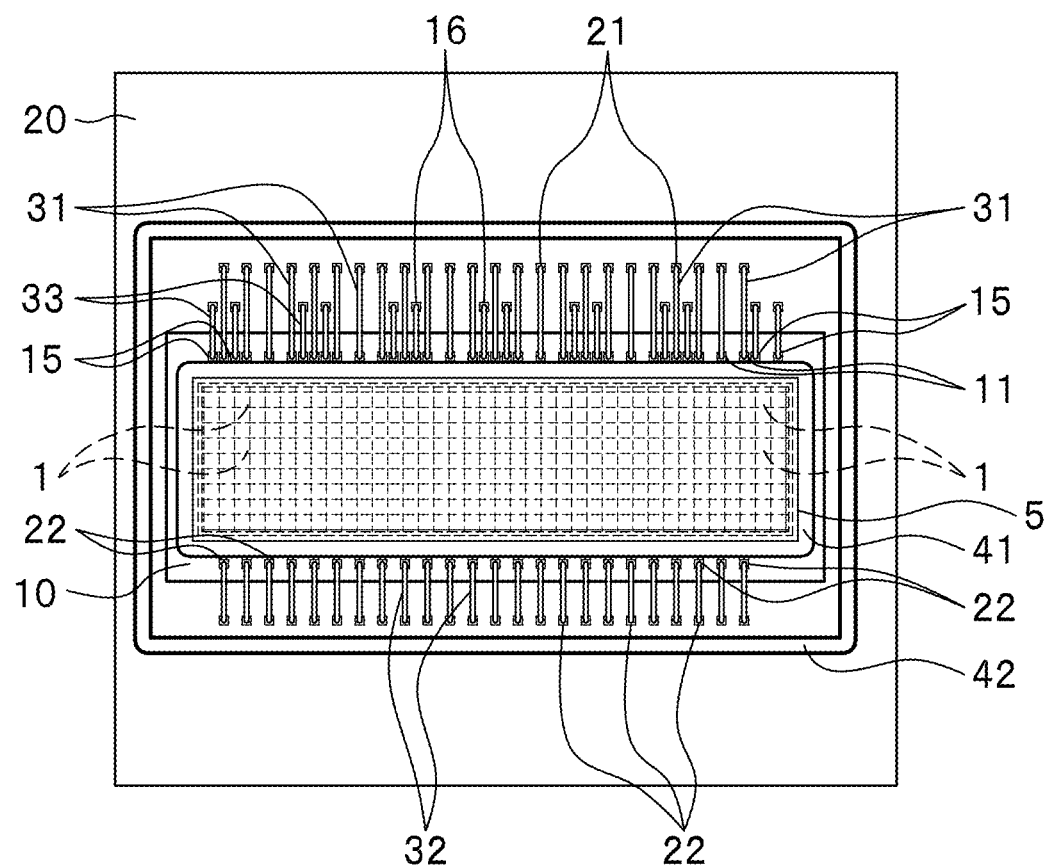
FIG. 9H is a schematic plan view illustrating the method of manufacturing the light-emitting module according to the embodiment.

FIG. 1 is a schematic perspective view of an entirety of the light-emitting module according to the embodiment. FIG. 2 is a schematic plan view of the entirety of the light-emitting module according to the embodiment. FIG. 3 is a schematic cross-sectional view taken along line III-III of FIG. 2. FIG. 4 is a schematic cross-sectional view taken along line IV-IV of FIG. 2. FIG. 5 is a schematic cross-sectional view taken along line V-V of FIG. 2. FIG. 6 is a schematic cross-sectional view taken along line VI-VI of FIG. 2. FIG. 7 is a schematic plan view of first and second projections and wires in the light-emitting module according to the embodiment.

A light-emitting module 100 includes: a plurality of light-emitting elements 1; a first substrate 10 having an upper surface that includes an element mounting region 13 on which the plurality of light-emitting elements 1 are disposed and including a plurality of first terminals 110 arranged along the element mounting region 13 at locations outward of the element mounting region 13 in a plan view on the upper surface of the first substrate 10; a second substrate 20 having an upper surface that includes a substrate mounting region 23 on which the first substrate 10 is disposed and including a plurality of second terminals 120 arranged along the substrate mounting region 23 at locations outward of the substrate mounting region 23 in the plan view on the upper surface of the second substrate 20; a plurality of wires 130, each connected to a corresponding one of the first terminals 110 and a corresponding one of the second terminals 120, the plurality of wires 130 arranged along an outer edge of the first substrate; a light-shielding covering member 40 disposed outward of the element mounting region 13 to cover the plurality of wires 130; and a light-transmissive first projection disposed along the element mounting region 13 between the element mounting region 13 and the first terminals 110 to be in contact with the covering member 40. The covering member 40 is disposed across the upper surface of the first substrate 10 and the upper surface of the second substrate 20. For example, a first projection 41 having a frame shape may be disposed on the first substrate 10 to surround the light-emitting elements 1.

In the element mounting region 13 of the first substrate 10, the light-emitting module 100 can include a light-reflective member 7 covering lateral surfaces of the light-emitting elements 1 such that the upper surfaces of the light-emitting elements 1 are exposed. The light-emitting module can further include a wavelength conversion member 5 covering the upper surfaces of the light-emitting elements 1.

The light-emitting module 100 mainly includes the light-emitting elements 1, the first substrate 10 on which the light-emitting elements 1 are mounted, the second substrate 20 on which the first substrate 10 is mounted, first wires 31 and second wires 32, which are the wires 130 electrically connecting the first substrate 10 and the second substrate 20, the covering member 40 covering the wires 130, the first projection 41 that is disposed on the first substrate 10 and is in contact with the covering member 40, a second projection 42 that is disposed on the second substrate and is in contact with the covering member 40, the light-reflective member 7 disposed on the first substrate 10 to cover the lateral surfaces of the light-emitting elements 1, and the wavelength conversion member 5 covering the upper surfaces of the light-emitting elements 1.

A description of components of the light-emitting module 100 will be given below.

First Substrate

The first substrate 10 includes a supporting member having a flat plate-like shape and wirings disposed on the upper surface of the supporting member. The first substrate 10 includes the element mounting region 13, on which the light-emitting elements are mounted, in the upper surface of the first substrate 10. The wirings are disposed in the element mounting region 13 to constitute a predetermined electric circuit. The first substrate includes the first terminals 110 as the wirings disposed on the upper surface at locations outward of the element mounting region, and each of the first terminals 110 is electrically connected to a corresponding one of the wirings disposed in the element mounting region. For example, the first substrate 10 may be a semiconductor substrate such as a silicon substrate, and a region of the upper surface on which the wirings are absent is covered with an insulating film. The wirings may be disposed inside the supporting member or on the lower surface of the supporting member. For example, an integrated circuit (IC) board in which circuits for driving a plurality of light-emitting elements are integrated may be used for the first substrate 10.

The light-emitting elements 1 are disposed in a matrix on the element mounting region 13. In one example, the element mounting region 13 may be a rectangular region in a plan view. In an example illustrated herein, the element mounting region 13 has a rectangular shape, and the first terminals 110 are disposed in rows along the long sides, opposite to each other, of the rectangular shape, with the element mounting region 13 located therebetween.

The first terminals 110 include a plurality of first external connection terminals 11 arranged in a row at locations outward of the element mounting region 13 along one of long sides of the rectangular element mounting region 13 and a plurality of second external connection terminals 12 arranged in a row along the other of the long sides opposite to the one long side. The first external connection terminals 11 are terminals to each of which a first end of a corresponding first wire 31 is connected. The second external connection terminals 12 are terminals to each of which a first end of a corresponding second wire 32 is connected. In the present example, the first external connection terminals 11 and the second external connection terminals 12 have a substantially rectangular shape and are arranged apart from each other in rows along long sides of the element mounting region 13. In one example, the first external connection terminals 11 are aligned at regular intervals. The first external connection terminals 11 and the second external connection terminals 12 may be arranged at respective intervals of 20 μm or more and 100 μm or less. The intervals among the first external connection terminals 11 may be equal to or different from the intervals among the second external connection terminals 12.

In the present example, the first substrate 10 includes a plurality of first driving terminals 15 to pass driving signals for turning on or off the light-emitting elements 1. For example, the first driving terminals 15 and the first external connection terminals 11 may be alternately arranged in the same row. Each of third wires 33 to be described below is connected to a corresponding one of the first driving terminals 15.

The light-emitting elements 1 are disposed in a matrix on the first substrate 10, and each of the light-emitting elements 1 is electrically connected to a corresponding one of the first terminals (that is, a first external connection terminal 11 or a second external connection terminal 12). The light-emitting elements 1 may include groups of light-emitting elements, each group constituted of a predetermined quantity of light-emitting elements, and the groups may be connected in series or in parallel with the first terminals.

For example, the wirings may be formed of a metal such as Cu, Ag, Au, Al, Pt, Ti, W, Pd, Fe, and Ni or an alloy of these metals. Such wirings may be formed by electroplating, electroless plating, vapor deposition, sputtering, or the like.

Second Substrate

The second substrate 20 includes a base member having a flat plate shape and wirings disposed at least on the upper surface of the base member. The second substrate 20 includes the substrate mounting region 23, on which the first substrate 10 is mounted, on the upper surface of the second substrate 20, and includes the second terminals 120 that are located outward of the substrate mounting region 23 on the upper surface of the second substrate 20.

In the substrate mounting region 23, the first substrate 10 is mounted with a bonding member disposed therebetween. The substrate mounting region 23 has an area dimension substantially equal to the area dimension of the first substrate 10 in a plan view. When the first substrate 10 is rectangular in a plan view, the substrate mounting region 23 can also be rectangular. In this example, the second terminals 120 include first wire connection terminals 21, each connected to a corresponding one of the first external connection terminals 11 via a corresponding wires, and second wire connection terminals 22, each connected to a corresponding one of the second external connection terminals 12 via a corresponding wire. The first wire connection terminals 21 and the second wire connection terminals 22 are disposed on two opposite sides with respect to the substrate mounting region 23 on the second substrate 20.

A plurality of first wire connection terminals 21 are disposed in a row outward of the substrate mounting region 23 along one of long sides of the rectangular substrate mounting region 23. The first wire connection terminals 21 are terminals to each of which the second end of each first wire 31 is connected, the first end of each first wire 31 being connected to a first external connection terminal 11.

A plurality of second wire connection terminals 22 are disposed in a row outward of the substrate mounting region 23 along the other long side (that is, the side opposite to the one long side described above with the substrate mounting region 23 located therebetween) of the rectangular substrate mounting region 23. The second wire connection terminals 22 are terminals to each of which the second end of each second wire 32 is connected, the first end of each second wire 32 being connected to a corresponding second external connection terminal 12. In the present example, the first wire connection terminals 21 and the second wire connection terminals 22 have respective substantially rectangular shapes and are arranged apart from each other along the substrate mounting region 23 in rows.

The intervals among the first wire connection terminals 21 and the intervals among the second wire connection terminals 22 may be 50 μm or more and 200 μm or less. The intervals among the first wire connection terminals 21 may be equal to or different from the intervals among the second wire connection terminals 22.

For example, the second terminals may be formed using substantially the same material and formation method as in the case of the wiring of the first substrate 10 described above.

In the present example, the second substrate 20 includes, on the upper surface of the second substrate 20, a plurality of second driving terminals 16 for driving that is configured to pass driving signals for turning on or off the light-emitting elements 1. For example, the second driving terminals 16 may be disposed inward of (that is, the substrate mounting region side) of the first wire connection terminals on the upper surface. The third wires 33 described below are connected to respective second driving terminals 16.

For the base member of the second substrate 20, a material that gives high heat dissipation performance is preferably used, and a material that exhibits high light-shielding performance and base member strength is more preferable. Specific examples of such a material include ceramics such as alumina, aluminum nitride, and mullite, resins such as a phenolic resin, an epoxy resin, a polyimide resin, a bismaleimide-triazine resin (BT resin), and polyphthalamide (PPA), and a composite material constituted of a resin and a metal or a ceramic. For the base member of the second substrate 20, a base member having a flat plate shape may be used, or a base member defining a cavity in the upper surface may be used. In this case, the first substrate 10 may be mounted in the cavity of the second substrate 20, with the bottom of the cavity serving as the substrate mounting region.

The second substrate 20 may include, on a surface of the substrate mounting region 23, wirings on which the first substrate 10 is to be mounted. The first substrate 10 and the second substrate 20 may be bonded together with a bonding material such as sintered Ag, solder, and bonding resin.

Wire

Examples of the wires 130 include electroconductive wires made of a metal such as gold, copper, platinum, and aluminum and/or an alloy containing at least any of these metals. Gold, which has a good thermal resistance and the like, is particularly preferable. Examples of the diameter of the wires include 15 µm or more and 50 µm or less. The plurality of wires 130 include the first wires and the second wires, each wire of the first and second wires connected to a corresponding one of the first terminals and a corresponding one the second terminals, and the third wires to pass driving signals for turning on or off the light-emitting elements 1. Each of the third wires 33 is connected to a corresponding one of the first driving terminals 15 disposed on the first substrate 10 and a corresponding one of the second driving terminals 16 disposed on the second substrate 20. The first wires, the second wires, and the third wires 33 differ from one another only in length and may be formed of substantially the same material.

The wires 130 may be disposed astride the long sides of the substantially rectangular first substrate 10 in a plan view, for example, substantially perpendicularly to the long sides.

Among the first wires 31 arranged in a row, first wires 31 located around the center of the row may be disposed substantially perpendicularly to the long side of the first substrate 10 in a plan view as described above, and first wires 31 disposed near the ends of the row may be disposed obliquely with respect to the long side of the first substrate 10 in a plan view. The same applies to the second wires 32.

The intervals among a plurality of first wires 31 may be equal to or different from each other. The intervals among the first wires 31 may be 20 µm or more and 100 µm or less. The intervals among the second wires 32 may be equal to or different from each other. The intervals among the second wires 32 may be 20 µm or more and 100 µm or less.

Light-Emitting Element

For example, each of the light-emitting elements 1 can have a substantially rectangular shape in a plan view and includes a semiconductor layered body and positive and negative electrodes disposed on the surface of the semiconductor layered body. The light-emitting element 1 includes the positive and negative electrodes on the same surface side and is flip-chip mounted on the first substrate 10 with the surface provided with the electrodes serving as the lower surface. In this example, the upper surface opposite to the surface provided with the electrodes serves as a main light extracting surface of the light-emitting element 1. In the light-emitting module 100, the light-emitting elements 1 are aligned on the first substrate 10 at predetermined intervals in the row and column directions. The size and number of the light-emitting elements 1 to be used may be appropriately selected according to the form of the light-emitting module to be obtained. In particular, it is preferable that smaller light-emitting elements 1 are more densely mounted. This allows for controlling an irradiation region with a larger number of divisions. Such a light-emitting module may be used as a light source for a high-resolution lighting system. For example, 1,000 to 20,000 light-emitting elements 1, each of which has a rectangular shape in a plan view and measures 40 to 100 µm per side, may be disposed in a matrix to form a rectangle as a whole.

Light-emitting elements with any appropriate wavelengths may be selected for the light-emitting elements 1. For example, as a blue or green light-emitting element 1, a light-emitting element including ZnSe, a nitride semiconductor ($In_XAl_YGa_{1-X-Y}N$, where $0 \leq X$, $0 \leq Y$, and $X+Y \leq 1$), or GaP may be selected. For a red light-emitting element 1, semiconductors represented by GaAlAs and AlInGaP may be suitably used. Alternatively, semiconductor light-emitting elements made of materials other than the above materials may be used. The composition and emission color of the light-emitting elements 1 to be used may be appropriately selected according to the purpose.

Bonding Member

The light-emitting elements 1 are bonded to the wiring disposed in the element mounting region 13 of the first substrate 10 using electroconductive bonding members as shown in FIG. 6. In the case in which the light-emitting elements 1 are flip-chip mounted on the first substrate 10, bumps of a metal material such as Au, Ag, Cu, and Al may be used for the bonding members. Alternatively, solder such as a AuSn based alloy and Sn-based lead-free solder may be used for the bonding members. In this case, the light-emitting elements 1 may be bonded to the first substrate 10 by using a reflow method. Alternatively, an electroconductive adhesive in which electroconductive particles are contained in a resin may be used for the bonding members. The light-emitting elements 1 and the first substrate 10 may be bonded together by using a plating technique. Examples of the material used in such a case include copper.

The light-emitting elements 1 and the first substrate 10 may be bonded together without the bonding members by directly bonding the electrodes of the light-emitting elements 1 and the wirings of the first substrate 10.

Light-Reflective Member

The light-reflective member 7 covers the upper surface of the first substrate 10 and the lateral surfaces of the light-emitting elements 1 as shown in FIG. 6. The upper surfaces of the light-emitting elements 1 are exposed from the light-reflective member 7. The light-reflective member 7 may cover the gaps between the lower surfaces of the light-emitting elements 1 and the first substrate 10. The light-reflective member 7 can reflect light emitted from the lateral surfaces of the light-emitting elements 1 to allow the light to be emitted from the upper surface of the wavelength conversion member 5, the upper surface serving as the emission surface of the light-emitting module 100. Accordingly, the light extraction efficiency of the light-emitting module 100 may be enhanced. In addition, a boundary between a light-emitting area and a non-light-emitting area may be clearly observed when the light-emitting elements 1 are individually turned on. This allows for improving the contrast ratio between the light-emitting area and the non-light-emitting area. The light-reflective member 7 may be spaced apart from the covering member 40 (first projection 41) or in contact with the covering member 40.

For the light-reflective member 7, a soft resin having a comparatively low elasticity and good shape conformability is preferably used. Examples of materials that may be preferably used for the light-reflective member 7 include resin materials having good light-transmittance and insulation performance, such as thermosetting resins including epoxy resins and silicone resins. A white resin in which particles of a light-reflective substance are mixed with the resin serving as the base material is preferably used for the light-reflective member 7. Suitable examples of the light-reflective substance include titanium oxide, aluminum oxide, zinc oxide, barium carbonate, barium sulfate, boron nitride, aluminum nitride, and glass filler. The light-reflective member 7 may contain a light-absorbing substance such as carbon black and graphite.

Wavelength Conversion Member

The wavelength conversion member 5 covers the upper surfaces of the light-emitting elements 1. The wavelength conversion member 5 collectively covers the upper surfaces of the light-emitting elements 1 and the upper surface of the light-reflective member. The upper surface of the wavelength conversion member 5 serves as the emission surface of the light-emitting module 100. The wavelength conversion member 5 is adapted to convert a wavelength of at least a portion of light emitted from the light-emitting elements 1 and emit the light to the outside.

In a plan view, the wavelength conversion member 5 has a substantially rectangular shape, the light-emitting elements 1 are located inward of an outer periphery of the wavelength conversion member 5.

The wavelength conversion member 5 may be provided by disposing a sheet or a plate on the light-emitting elements 1 or by application on the light-emitting elements 1 by spraying or the like to form a layer. Alternatively, injection molding using a mold or the like, transfer molding, compression molding, or the like may be employed.

Examples of the wavelength conversion member include a sintered body of a phosphor and a mixture of phosphor powder and a base material such as resin, glass, and other inorganic substances. Examples of the base material include epoxy resins, silicone resins, mixtures of these resins, and light-transmissive materials such as glass. For example, the thickness of the wavelength conversion member 5 may be about 20 µm or more and 100 µm or less. The wavelength conversion member 5 has a size sufficient to cover the entire upper surfaces of the light-emitting elements 1. In the present example, the wavelength conversion member 5 extends to have contact with the first projection 41 described below.

Examples of the phosphor include yttrium-aluminum-garnet based phosphors (such as $Y_3(Al,Ga)_5O_{12}:Ce$), lutetium-aluminum-garnet based phosphors (such as $Lu_3(Al,Ga)_5O_{12}:Ce$), terbium-aluminum-garnet based phosphors (such as $Tb_3(Al,Ga)_5O_{12}:Ce$), nitride based phosphors such as β-SiAlON based phosphors (such as $(Si,Al)_3(O,N)_4:Eu$), α-SiAlON based phosphors (such as $Ca(Si,Al)_{12}(O,N)_{16}:Eu$), CASN based phosphors (such as $CaAlSiN_3:Eu$) and SCASN based phosphors (such as $(Sr,Ca)AlSiN_3:Eu$), fluoride based phosphors such as KSF based phosphors (such as $K_2SiF_6:Mn$), KSAF based phosphors (such as $K_2(Si,Al)F_6:Mn$), and MGF based phosphors (such as $3.5MgO\cdot0.5MgF_2\cdot GeO_2:Mn$), phosphors having the perovskite structure (such as $CsPb(F,Cl,Br,I)_3$), and quantum-dot phosphors (such as CdSe, InP, $AgInS_2$, and $AgInSe_2$).

Covering Member

The covering member 40 is made of a light-shielding resin and disposed outward of the element mounting region 13 to cover the wires 130 (specifically, the first wires 31 and the second wires 32). In an example, the covering member 40 is formed into a frame shape in a plan view to cover the first wires 31 and the second wires 32 and surround the element mounting region 13. The covering member 40 is disposed in contact with the first projection described below. The covering member 40 also covers the third wires 33. The covering member 40 is disposed apart from the wavelength conversion member 5.

The distance between the light-reflective member 7 and the covering member 40 is preferably 100 µm or more and 500 µm or less. The distance between the wavelength conversion member 5 and the covering member 40 may be equal to or different from the distance between the light-reflective member 7 and the covering member 40.

The covering member 40 formed into a frame shape is wider on long sides of the rectangle of the first substrate having a substantially rectangular shape in a plan view than in regions on short sides. Further, the height (that is, the distance from the upper surface of the second substrate 20 to the upper surface of the covering member 40) of the covering member 40 is greatest directly above the top portions (looptops of the wires in this case) of the wires 130. In other words, the covering member 40 is disposed such that a top portion 40a of the covering member 40 overlaps with the top portions of the wires 130. The position of the top portion 40a of the covering member 40 is located above a top portion 41a of the first projection 41 described below.

Examples of the light-shielding covering member 40 include a resin containing a light-shielding filler. Examples of the resin serving as the base material include silicone resins, modified silicone resins, epoxy resins, modified epoxy resins, and acrylic resins. Examples of the light-shielding filler include light-absorbing substances such as pigments, carbon black, and graphite and substantially the same light-reflective substances as the light-reflective substance contained in the light-reflective member described above. Specific examples of the resin include a white resin having good light-reflective properties, a black resin having good light-absorbing properties, and a gray resin having light-reflective properties and light-absorbing properties. The covering member 40 may include a plurality of layers of these resins.

Among these resins, a white resin having light-reflective properties is preferably used at least on the outermost surface of the covering member 40, considering deterioration of the resin due to absorption of light.

First Projection and Second Projection

The light-emitting module includes the light-transmissive first projection that is disposed between the element mounting region 13 and the first terminals 110 on the first substrate 10 along the element mounting region 13 to have contact with the covering member 40. Further, the light-emitting module includes the second projection that is disposed on the upper surface of the second substrate 20 outward of the second terminals 120 and is in contact with the covering member 40. That is, the covering member 40 is disposed across the upper surface of the first substrate 10 and the upper surface of the second substrate 20 between the first projection and the second projection.

The covering member 40 is disposed between the first projection 41 disposed on the first substrate 10 to surround the element mounting region 13 and the second projection 42 disposed on the second substrate 20 to surround the substrate mounting region 23. Such an arrangement of the covering member 40 may be obtained by supplying an uncured resin to constitute the covering member 40 to a frame surrounded by the first projection 41 and the second projection 42. In other words, when the uncured resin to constitute the covering member 40 is supplied, the first projection 41 and the second projection 42 may be used as a dam to obstruct the flow of the uncured resin.

The first projection 41 and the second projection 42 may be allowed to have predetermined heights by stacking a plurality of uncured resins in the height direction. For example, the first projection 41 and the second projection 42 with predetermined heights may be achieved by disposing one tier of resin having a viscosity adjusted to a predetermined value on the substrate through a nozzle and repeating this operation.

In the light-emitting module, the first projection 41 is disposed on the first substrate such that the top portion of the first projection 41 is located above the light-emitting elements 1 and the wavelength conversion member 5.

The height of the first projection 41 from the upper surface of the first substrate may be equal to or different from the height of the second projection from the upper surface of the second substrate. In the case in which the heights are different, the second projection is preferably higher than the first projection. In this case, the difference between the height from the upper surface of the second substrate to the top portion of the first projection and the height from the upper surface of the second substrate to the top portion of the second projection may be smaller than the thickness (that is, the distance from the upper surface to the lower surface of the first substrate 10) of the first substrate 10. This structure can inhibit the uncured resin to constitute covering member 40 from overflowing out of the second projection when the covering member 40 is disposed between the first projection 41 and the second projection 42.

For the first projection and the second projection, examples of the resins for the base material of the covering member described above may be used. The resins to constitute the first projection and the second projection preferably have higher viscosities than the resin to constitute the covering member 40. For example, the viscosity of the resins may be adjusted with the amounts of fillers for controlling viscosities to be mixed with the resins.

The first projection 41 transmits light emitted from the light-emitting elements 1 and the wavelength conversion member 5. A light-transmissive insulating resin material such as thermosetting resins including epoxy resins and silicone resins may be suitably used for the first projection 41. The first projection 41 is formed into a shape of a rectangular frame surrounding the element mounting region in a plan view. In an example, the covering member 40 is in contact with the top portion of the first projection 41.

The first projection 41 is formed into a rectangular frame shape on the first substrate 10 along the perimeter of the element mounting region 13 in a plan view. The first projection 41 is disposed between the sides in the longitudinal direction of the element mounting region 13 and the first terminals 110 at positions along the longitudinal direction of the element mounting region 13 and is disposed on the first substrate 10 between the element mounting region 13 and the outer edges of the first substrate at positions along the width direction of the element mounting region 13.

The first projection 41 preferably has an inclined surface inclined from the substrate side toward the top portion of the first projection. The inclined surface is preferably a curved surface convex outward. Specifically, the first projection 41 preferably has a semicircular or semi-elliptic shape in a cross-sectional view. With this structure, the surface of the covering member 40 in contact with the first projection 41 may be a curved surface convex toward the covering member 40. With the covering member 40 having such a surface profile, light, which is emitted from the wavelength conversion member 5 and is transmitted through the first projection to the covering member 40, may be reflected toward the first substrate 10. Accordingly, unintended leaking light and stray light are inhibited from traveling upward (light extracting side), so that a light-emitting module that reduces scattering of light may be obtained.

In the light-emitting module, the second projection 42 is disposed below the light-emitting elements 1 and the wavelength conversion member 5 (that is, on the side opposite to the light extracting side). The second projection 42 may or may not transmit light emitted from the light-emitting elements 1. Similarly to the case of the first projection 41, the second projection 42 may be used as a dam to obstruct the flow of the uncured resin to constitute the covering member 40 in the manufacturing. The second projection 42 is preferably disposed in the same step as the first projection 41 or a contiguous step, preferably using a light-transmissive resin as in the case of the first projection 41 in view of simplification of the manufacturing method.

Even in the case in which the first substrate 10 is rectangular and in which the wires 130 are disposed only along the long sides of the rectangle, the top portions of the covering member 40 disposed along the short sides of the first substrate 10 preferably have substantially the same heights as the top portions of the covering member 40 disposed along the long sides of the first substrate 10.

In the light-emitting module 100, light emitted from the wavelength conversion member 5 may be transmitted through the first projection 41, which is light-transmissive. Light transmitted through the first projection 41 is reflected at the interface with the covering member 40 toward the first substrate 10, so that the light-emitting module 100 can reduce scattered light.

As an example, the light-emitting module 100 having the structure described above may be used as a light source for a vehicle headlight. In this case, for example, a structure in which light is emitted to the outside from the light source through a lens may be employed. The light-emitting elements 1 in the light-emitting module 100 are turned on with an external power switch. The light-emitting module 100 has a structure in which part or all of predetermined light-emitting elements 1 may be individually driven.

In the light-emitting module 100, the covering member 40 has light-shielding properties and is disposed in contact with the first projection 41, so that light transmitted through the first projection 41 may be absorbed or reflected toward the substrate by the covering member 40. This allows for reducing scattering of light to the outside, and the light-emitting module 100 that shows reduced leaking light and stray light may be obtained. Stray light is reduced in the light-emitting module 100, which facilitates the optical design of the lens when the lens is combined. Further, the covering member 40 contains the light-reflective substance and/or the light-absorbing substance as fillers for imparting light-shielding properties, so that the amount of the resin in the covering member 40 may be less than in the case in which a light-transmissive resin not containing these fillers is used. This structure can reduce the load on the wires due to thermal expansion of the resin. With reduced effects of heat on the wires, the connectivity of the wires is improved, so that a reliable light-emitting module may be obtained.

Method of Manufacturing Light-emitting Module

Next, a method of manufacturing the light-emitting module will be described with reference to FIG. 8 and FIG. 9A to FIG. 9H.

FIG. 8 is a flowchart illustrating the method of manufacturing the light-emitting module according to the embodiment. FIG. 9A to FIG. 9H are schematic plan views illustrating the method of manufacturing the light-emitting module according to the embodiment. The light-emitting elements 1 are mounted at predetermined intervals, but the intervals are not shown except in the schematic enlarged plan view of FIG. 9C.

The method of manufacturing the light-emitting module includes: a step S11 of mounting a plurality of light-emitting elements in the element mounting region of the first substrate; a step S13 of mounting the first substrate in the substrate mounting region of the second substrate; a step S14 of connecting via the wires a plurality of first terminals disposed outward of the element mounting region of the first substrate and a plurality of second terminals disposed outward of the substrate mounting region of the second substrate; a step S16 of disposing the light-transmissive first projection along the element mounting region between the element mounting region and the first terminals; and a step S18 of disposing the light-shielding covering member outward of the first projection to be in contact with the first projection and to cover the wires. In the present example, a step S17 of disposing the second projection outward of the second terminals on the second substrate is performed before or after the step S16 of disposing the first projection. Further, in the present example, a step S12 of disposing the light-reflective member is performed after the step S11 of mounting the elements. Each of these steps will be described below.

In the step S11 of mounting the elements, a plurality of light-emitting elements 1 are mounted in the element mounting region 13 of the first substrate 10. In the step S11 of mounting the elements, a product including a plurality of light-emitting elements arranged on a supporting substrate at predetermined intervals is provided, the light-emitting elements 1 are bonded to the element mounting region of the first substrate, and the supporting substrate is removed. Before the step S11 of mounting the elements, the first substrate 10 in which the wiring such as the first terminals has already been disposed is preferably prepared. The first terminals 110 may be formed by applying Cu or Al metal foil, applying paste containing powder of a metal such as Cu and Ag, Cu plating, or the like. The wiring to be electrically connected to the light-emitting elements 1 in the element mounting region may be patterned by etching, printing, or the like. The first substrate 10 may be provided by purchasing or the like.

For example, the light-emitting elements 1 may be electrically bonded to the element mounting region 13 of the first substrate 10 by plating. The light-emitting elements 1 are aligned in the row and column directions at predetermined intervals in the element mounting region. The light-emitting elements 1 may be provided through part or the whole of the manufacturing, such as through a step such as growing a semiconductor. Alternatively, the light-emitting elements 1 may be provided by purchasing or the like.

In the step S12 of disposing the light-reflective member, the lateral surfaces of the light-emitting elements 1 are covered with the light-reflective member after the light-emitting elements 1 are mounted in the element mounting region 13 of the first substrate 10. In the present example, the light-reflective member, such as a white resin, is disposed on the lateral surfaces of the light-emitting elements 1 between adjacent ones of the light-emitting elements 1 after the light-emitting elements 1 are mounted on the first substrate 10. In the step S12 of disposing the light-reflective member, the upper surfaces of the light-emitting elements 1 are covered with masks before the light-reflective member 7 is disposed, and the masks are removed after the light-reflective member 7 is disposed, so that the upper surfaces of the light-emitting elements 1 may be exposed from the light-reflective member 7.

In the step S13 of mounting the substrate, the first substrate 10 is mounted in the substrate mounting region 23 of the second substrate 20. In the present example, the first substrate 10 on which the light-emitting elements 1 have been mounted is disposed on the substrate mounting region 23 of the second substrate 20 and the first substrate 10 and the second substrate 20 are bonded via, for example, a bonding material such as sintered Ag disposed therebetween. The second substrate 20 on which the wirings such as the second terminals has been disposed is provided before the step S13 of mounting the substrate.

In the step S14 of connecting via the wires, the first terminals 110 of the first substrate 10 are connected to the second terminals 120 of the second substrate 20 via the wires 130. Specifically, a plurality of first external connection terminals 11 of the first substrate 10 are connected to a plurality of first wire connection terminals 21 of the second substrate 20 via a plurality of first wires 31, and a plurality of second external connection terminals 12 of the first substrate 10 are connected to a plurality of second wire connection terminals 22 of the second substrate 20 via a plurality of second wires 32. The step S14 of connecting via the wires includes connecting the third wires 33 to the first driving terminals 15 of the first substrate 10 and the second driving terminals 16 of the second substrate 20.

The wires are preferably connected first to the first external connection terminals 11 disposed on the first substrate 10 and then to the first wire connection terminals 21 disposed on the second substrate. By connecting the wires in this order, the top portions of the wires may be located closer to the first external connection terminals 11. That is, the wires may be formed along the step portion between the first substrate 10 and the second substrate 20. This allows the amount of the resin disposed below the wires to be reduced in a step of disposing the covering member described below, so that disconnection of the wires attributable to thermal expansion of the covering member may be inhibited.

In a step S15 of disposing the wavelength conversion member, the wavelength conversion member 5 covering the light-emitting elements 1 is disposed. The wavelength conversion member 5 having formed into a sheet having a predetermined size is provided and disposed on the light-emitting elements 1. The wavelength conversion member 5 may be fixed to the light-emitting elements 1 with a light-transmissive bonding member such as resin therebetween or may be fixed without the bonding member using tackiness or the like of the wavelength conversion member.

In the step S16 of disposing the first projection, the light-transmissive first projection 41 is disposed on the upper surface of the first substrate 10 between the element mounting region 13 and the first terminals 110 along the element mounting region 13. In the step S16 of disposing the first projection, the first projection 41 is disposed by moving a nozzle of a dispenser along the element mounting region 13 while an uncured resin to constitute the first projection 41 is supplied from the nozzle.

In the step S17 of disposing the second projection, the second projection is disposed on the upper surface of the second substrate 20 outward of the second terminals. The same material is preferably used for the first projection 41 and the second projection 42, and this allows for performing the step S16 of disposing the first projection and the step S17 of disposing the second projection as the same step.

In the step S16 of disposing the first projection and the step S17 of disposing the second projection, the second projection 42 may be first disposed in the step S17 of disposing the second projection, and the first projection 41 may then be disposed in the step S16 of disposing the first projection. Further, the step S16 of disposing the first projection may be performed at the same time as the step S17 of disposing the second projection to dispose the first projection 41 and the second projection 42 at substantially the same time.

In the step S18 of disposing the covering member, the light-shielding covering member is disposed outward of the first projection to be in contact with the first projection and to cover the wires. More specifically, the light-shielding covering member 40 that contains a resin having a viscosity lower than that of the first projection 41 and that of the second projection 42 as the base material is disposed between the first projection 41 and the second projection 42. The covering member 40 is disposed across the first substrate 10 and the second substrate 20. The covering member 40 also covers the lateral surfaces of the first substrate 10. The position of the top portion 40a of the covering member 40 disposed in the step S18 of disposing the covering member is located above the top portion 41a of the first projection 41. In order to allow the position of the top portion 40a of the covering member 40 to be located above the top portion 41a of the first projection 41, for example, supply of a resin is preferably repeated a plurality of times before the supplied resin is cured. A resin for the covering member 40 is preferably supplied from directly above the top portions of the wires. This allows the top portions of the wires to be easily covered with the covering member 40.

For example, in the step S16 of disposing the first projection, the step S17 of disposing the second projection, and the step S18 of disposing the covering member, the first projection 41 and the second projection 42 may be made of a silicone resin, and the covering member can also be made of a silicone resin. The viscosity of the uncured resin to constitute the covering member may be adjusted by adding a filler for adjusting physical properties or the viscosity of a resin used for the resin. The expression "disposing the first projection 41 and the second projection 42" in this steps includes depositing uncured or preferably semi-cured resin material, and does not necessarily include fully curing the deposited material.

Figure 10A:
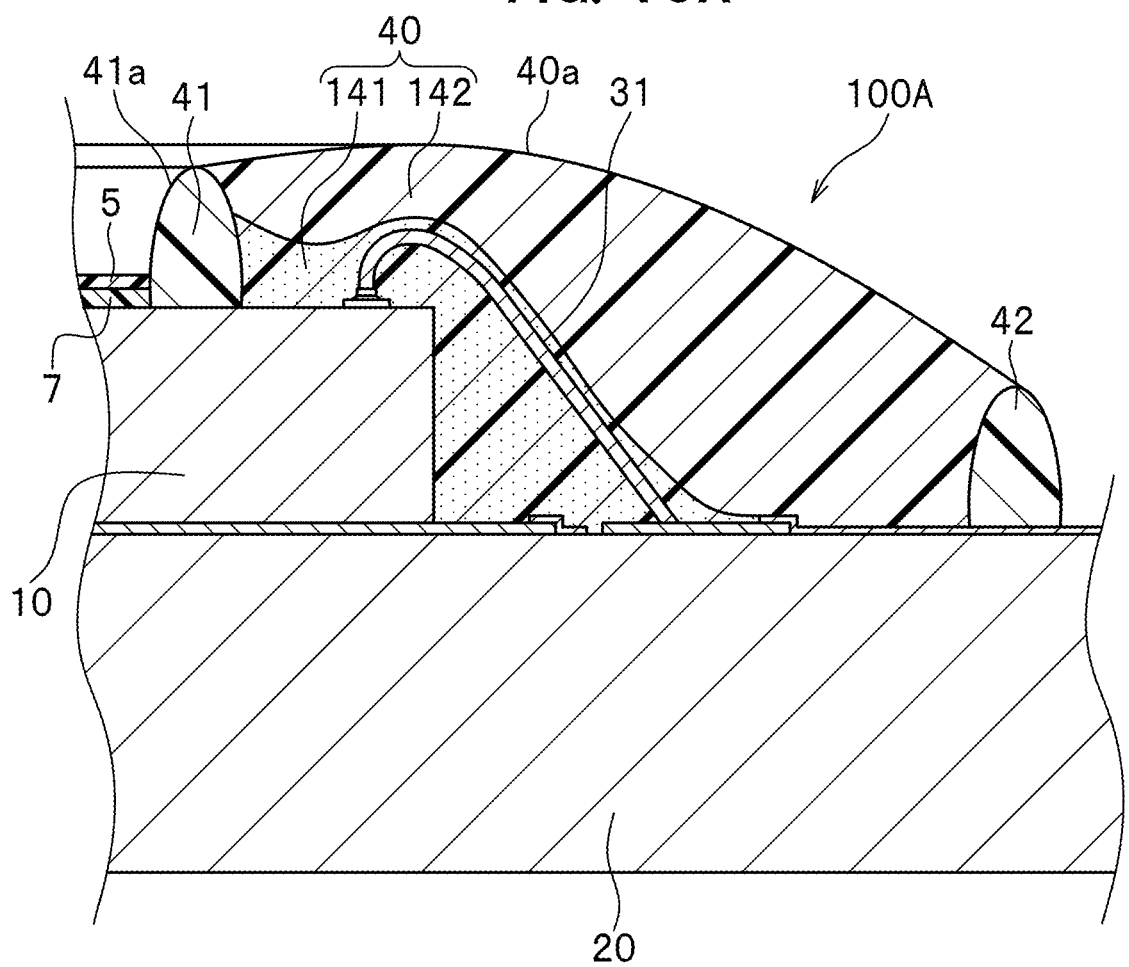
FIG. 10A is a schematic cross-sectional view of a first variation of the embodiment.

The covering member 40 and the first projection 41 may have structures shown in FIG. 10A to FIG. 10C. Each variation of the embodiment is described below with reference to each drawing. FIG. 10A is a schematic cross-sectional view of a first variation of the embodiment. FIG. 10B is a schematic cross-sectional view of a second variation of the embodiment. FIG. 10C is a schematic cross-sectional view of a third variation of the embodiment. Structures that have already been described are indicated by the same reference numerals, and the descriptions of the structures are omitted. Alternatively, illustration of the structures is omitted to prevent repeated descriptions.

First Variation

In a light-emitting module 100A, the covering member 40 may have a structure including a first covering member 141 that is in contact with the first projection 41 and covers the wires 130, and a second covering member 142 covering the first covering member 141 as shown in FIG. 10A.

The first covering member 141 is disposed across the first substrate 10, and the second substrate 20 to cover the first wires 31, the second wires 32, and the third wires 33. One end portion of the first covering member 141, which is an end portion on the first substrate 10 side, is in contact with the first projection 41. The other end portion of the first covering member 141, which is an end portion on the second substrate 20 side, is spaced apart from the second projection 42.

For the first covering member 141, a resin having a dark color (such as a black or gray resin) in which a light-absorbing substance serving as a light-shielding filler is contained in a resin serving as the base material may be used. A thermosetting resin such as an epoxy resin and a silicone resin may be used for the base material. A resin having a lower elasticity than the second covering member 142 is preferably used for the first covering member 141 to cover the wires 130. Using a resin having a low elasticity for the first covering member 141 allows for further reducing influence of heat on the wires and enhance the reliability of connections of the wires. In the case in which a resin having a dark color is used for the first covering member 141, the second covering member 142 covering the first covering member 141 is preferably made of a light-reflective white resin. This structure allows for reducing deterioration of the first covering member 141 caused by absorption of external light and secures reliability as the light-emitting module.

The second covering member 142 is preferably disposed so as to cover the first covering member 141 and have contact with the first projection 41. The second covering member 142 is preferably formed of a white resin containing a light-reflective substance as described above. The second covering member 142 is preferably formed of a resin having a higher elasticity than the first covering member 141. The second covering member 142 is disposed with one end portion being in contact with the first projection 41 and the other end portion being in contact with the second projection 42. The elasticities of the first covering member 141 and the second covering member 142 may be adjusted by adding a plasticizer or using different resin materials. When using a resin having a low elasticity for the first covering member 141 and using a resin having a high elasticity for the second covering member 142, mechanical effects from the outside may be reduced, and effects of thermal expansion on the wires 130 may be reduced.

Figure 11:
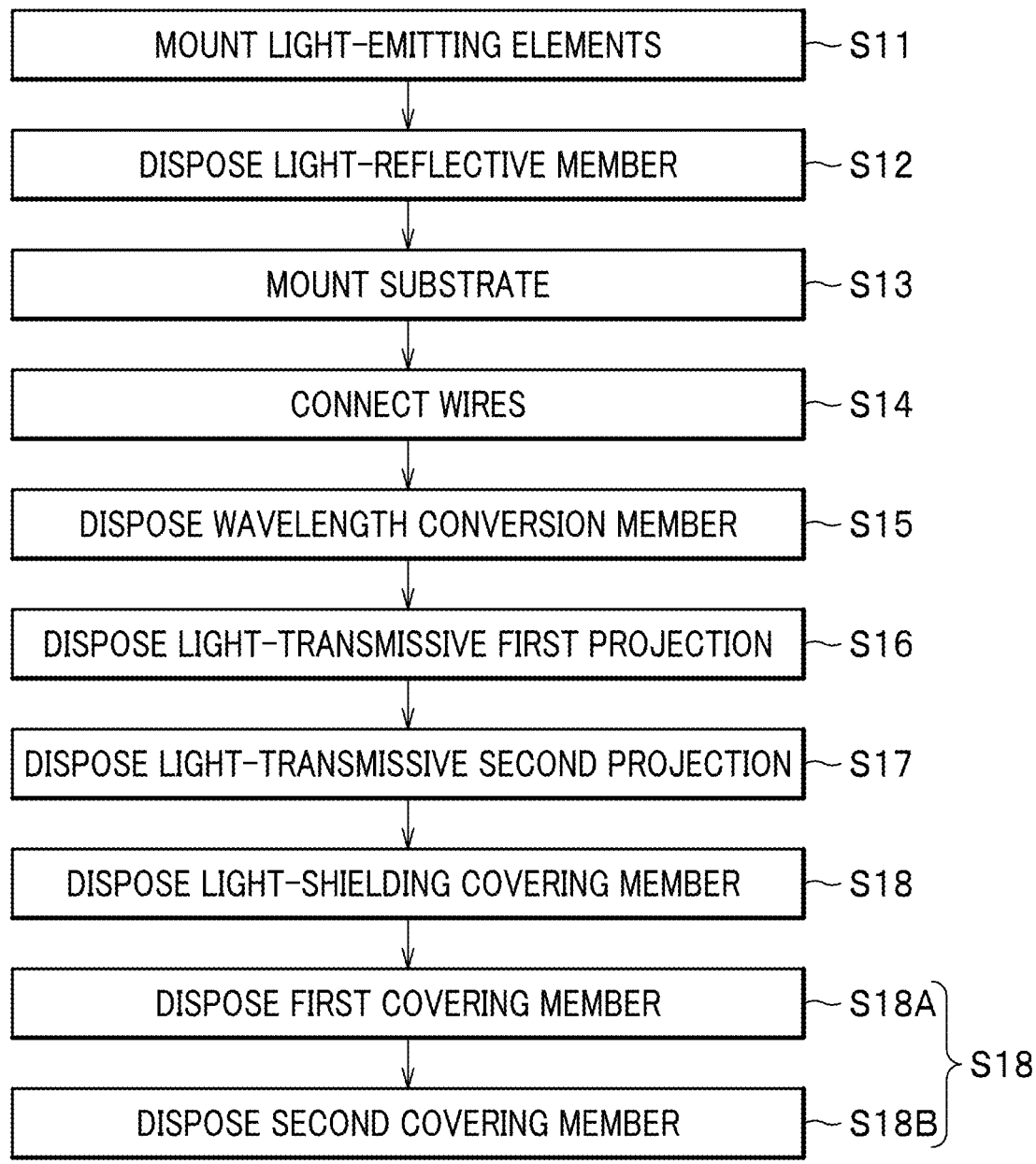
FIG. 11 is a flowchart illustrating a method of manufacturing a light-emitting module of the first variation.

In a method of manufacturing the light-emitting module 100A, the step S18 of disposing the covering member as that in the method of manufacturing described above includes a step S18A of disposing the first covering member and a step S18B of disposing the second covering member as shown in FIG. 11. In the step S18A of disposing the first covering member, the resin to constitute the first covering member 141 is supplied from a nozzle to cover the wires 130. One end portion of the first covering member 141 is disposed in contact with the outer lateral surface of the first projection 41. The other end portion of the first covering member 141 is spaced apart from the second projection.

In the step S18B of disposing the second covering member, the second covering member 142 is disposed to cover the first covering member 141. One end portion of the second covering member 142 is disposed in contact with the first projection. The second covering member 142 is disposed on the first covering member 141 such that the top portion is located above the top portion 41a of the first projection 41.

Second Variation and Third Variation

Each of light-emitting modules 100B and 100C may have a structure in which a first projection 241 covers the perimeter of the wavelength conversion member 5 as shown in FIG. 10B and FIG. 10C.

The first projection 241 includes a first portion 241a covering the wavelength conversion member 5, a second portion 241b serving as the top portion of the first projection 241, and a third portion 241c that absorbs or reflects light incident on the first projection 241 as shown in FIG. 10B and FIG. 10C.

The first portion 241a is disposed to cover at least a portion of the outer edges of the wavelength conversion member 5, that do not face the light-emitting elements 1. The first portion 241a covers the outer edges of the wavelength conversion member 5 to facilitate entry of scattered light into the first projection 241. The first portion 241a may cover the outer edges of the wavelength conversion member 5 along the long sides of a rectangular shape of the wavelength conversion member 5 in a plan view. The first portion 241a may cover the outer edges of the wavelength conversion member 5 along the short sides of the wavelength conversion member 5 in addition to the outer edges of the wavelength conversion member 5 along the long sides.

The second portion 241b serves as the top portion of the first projection 241 and has a curved surface convex upward. The top portion of the first projection 241 is located above the top portions of the wires, so that the second portion 241b functions as a dam when the covering member 40 is disposed.

The third portion 241c has a curved shape convex toward the covering member 40 at the interface between the first projection 241 and the covering member 40. The third portion 241c forms a curved surface from the top portion toward the outer lateral surface to reflect light entering the first projection 241 toward the first substrate 10. With the third portion 241c, light incident on the first projection 241 is reflected toward the first substrate 10 and hindered from being emitted to the outside.

In the light-emitting module 100B, one end portion of the covering member 40 has the same structure as in the light-emitting module 100 shown in FIG. 6 described above and is disposed in contact with the outer lateral surface of the first projection 241 in a region extending beyond the top portion of the first projection 241, a region extending to the top portion, or a region below the top portion.

In the light-emitting module 100C, the first projection 241 has the same structure as in the light-emitting module 100B of the second variation shown in FIG. 10B, and the covering member 40 has the same structure as in the light-emitting module 100A of the first variation shown in FIG. 10A. Accordingly, in the light-emitting module 100C, one end portion of the first covering member 141 and one end portion of the second covering member 142 are disposed in contact with the outer lateral surface of the first projection 241.

In each of the light-emitting modules 100B and 100C, the first portion 241a of the first projection 241 covers the outer edges of the wavelength conversion member 5 to prevent the first projection 241 from being apart from the wavelength conversion member 5, so that the light-emitting elements 1 may be protected against dust and water. This allows for enhancing the reliability of the light-emitting module. This structure is particularly preferable in the case in which an integrated circuit (IC) board is used for the first substrate 10.

A method of manufacturing the light-emitting module 100B or the light-emitting module 100C includes a step S16A of disposing the first projection in which two or more tiers of an uncured resin to constitute the first projection 241 are disposed on the first substrate 10 in the step S16 of disposing the first projection described above. At this time, the second tier of the resin is supplied outward of the first tier to lie on the first tier. The first projection 241 including the first portion 241a covering the perimeter of the wavelength conversion member 5, the second portion 241b serving as the top portion of the first projection 241, and the third portion 241c having a curved surface continuous with the top portion is thus disposed.

In the method of manufacturing the light-emitting module 100B, the step S18 of disposing the covering member may be performed as the same step as for the light-emitting module 100 described above.

In the method of manufacturing the light-emitting module 100C, similarly to the case of the light-emitting module 100A described above, the step S18 of disposing the covering member may be performed through the step S18A of disposing the first covering member and the step S18B of disposing the second covering member.

Figure 12:
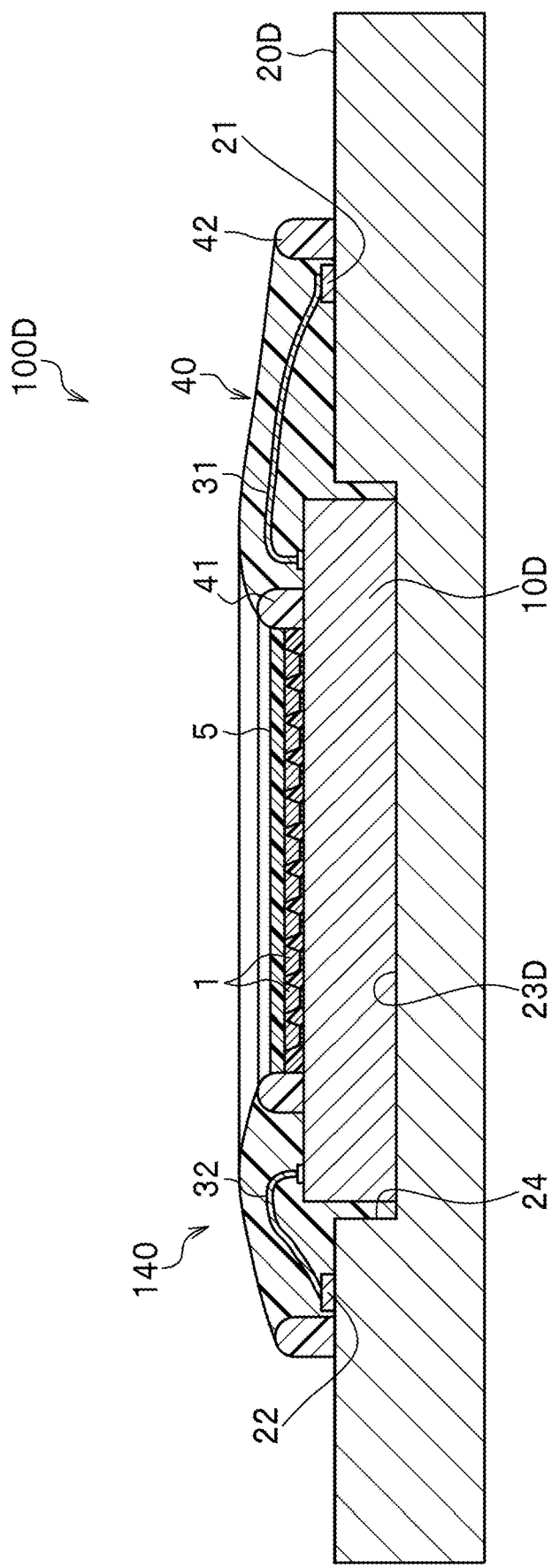
FIG. 12 is a schematic cross-sectional view of a fourth variation of the embodiment.

A light-emitting module 100D may have a recess 24 at the central region of a second substrate 20D and a substrate mounting region 23D inside the recess 24 as shown in FIG. 12. The second substrate 20D has the recess 24 defining the substrate mounting region 23D as described above.

This allows for reducing the whole thickness of the light-emitting module 100D.

Figure 13:
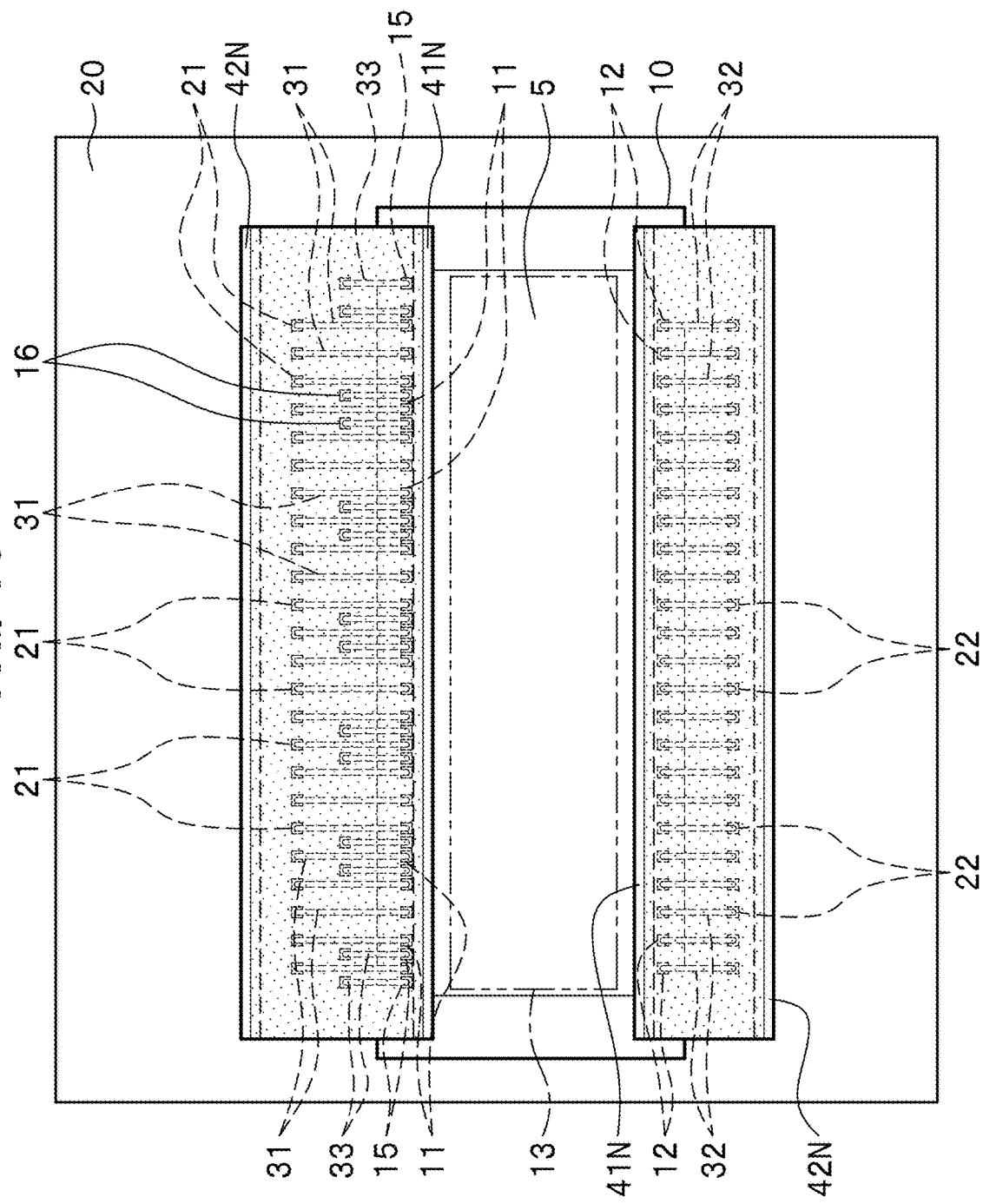
FIG. 13 is a schematic plan view of another structure of the embodiment.
Figure 14:
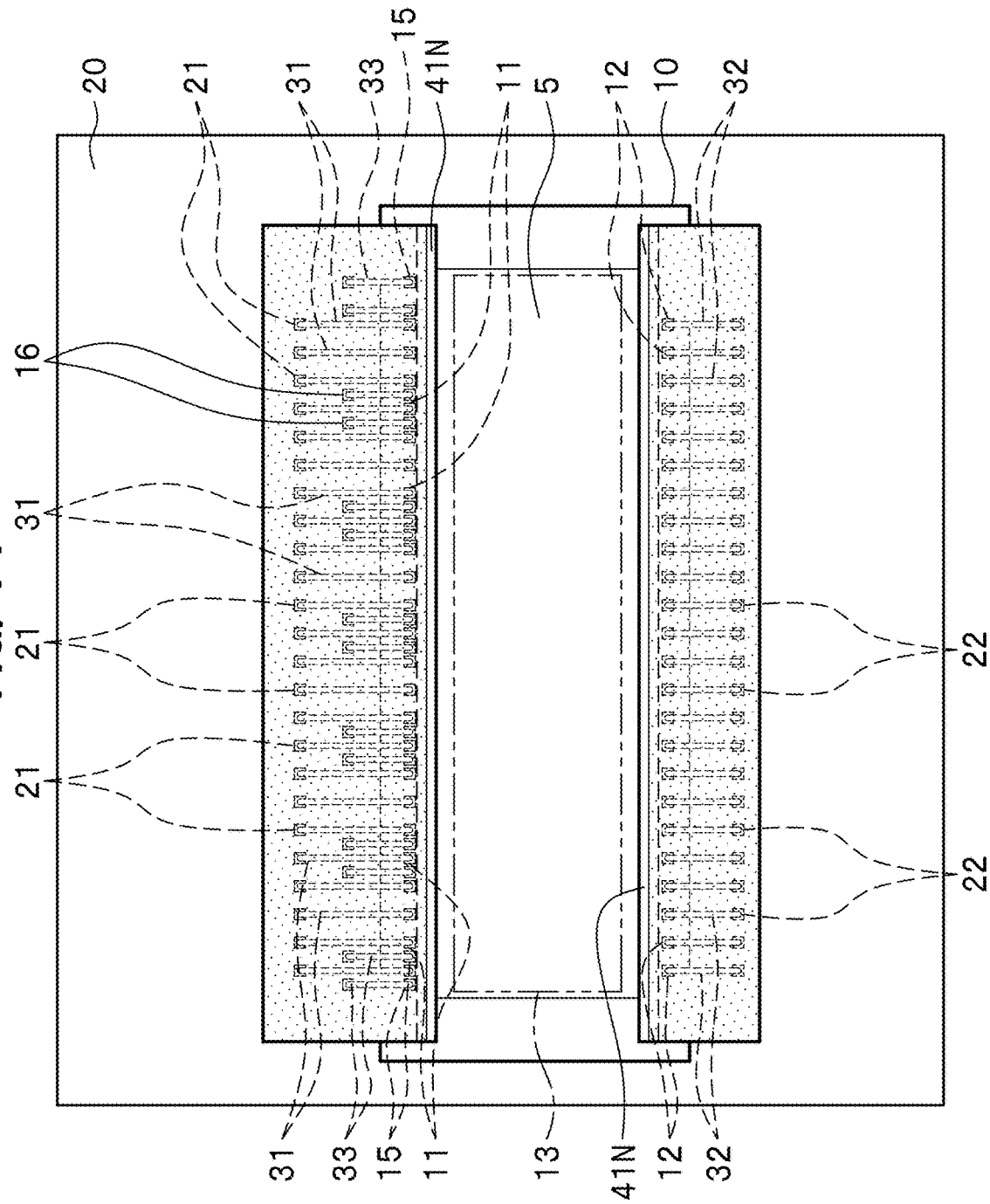
FIG. 14 is a schematic plan view of still another structure of the embodiment.

Further, in each of the light-emitting modules described above, an arrangement of first projections 41N and second projections 42N as shown in FIG. 13 and FIG. 14 may be employed.

That is, in each light-emitting module, the first projections 41N are disposed on the first substrate 10 to face each other across the element mounting region 13 as shown in FIG. 13. That is, the first projections 41N are in linear forms facing each other and extending along the longitudinal direction of the element mounting region 13. The light-transmissive first projections 41N are disposed in contact with the wavelength conversion member 5 along the element mounting region 13 between the element mounting region 13 and the first and second external connection terminals 11 and 12, which are the first terminals 110.

The second projections 42N are disposed on the upper surface of the second substrate 20 outward of the first wire connection terminals 21 and the second wire connection terminals 22, which are the second terminals 120, to have contact with the covering member 40. The second projections 42N having lengths facing the first projections 41N are linearly disposed.

In each light-emitting module, the second projections 42N may not be disposed as shown in FIG. 14.

EXAMPLES

Subsequently, examples of the light-emitting module according to the invention of the present application are described with reference to FIG. 15 to FIG. 17B. The scope of the invention of the present application is not limited to these examples.

Figure 17A:
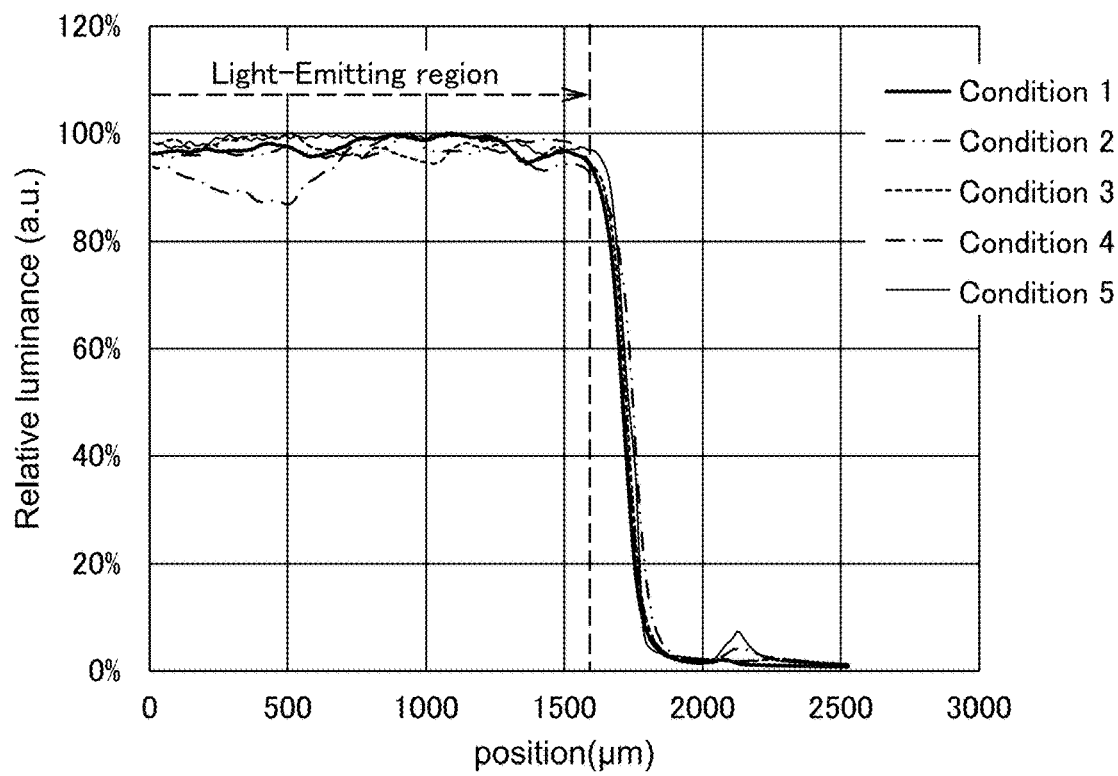
FIG. 17A is a graph showing relative luminance on an emission surface of the light-emitting module.
Figure 17B:
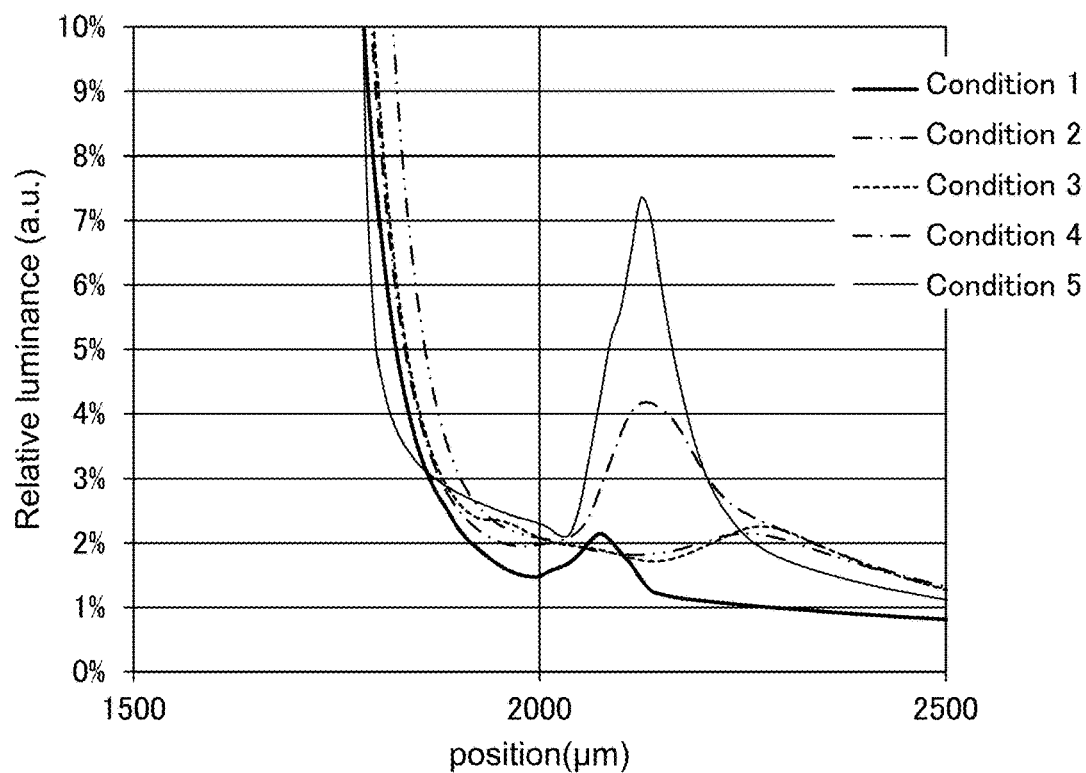
FIG. 17B is an enlarged graph of a portion of the graph shown in FIG. 17A.

A light-emitting module having the structure described below is formed, and an average luminance (cd/m$^2$) of front light of a light-emitting module 100S when a pulsed current of 2.5 mA (duty: 10%) per a single light-emitting element is applied is measured. FIG. 17A and FIG. 17B are graphs showing the relationship between the relative value (relative luminance (a.u.)) of the average luminance of a light-emitting region and the distance from the substantial center of the light-emitting region, in which the vertical axis shows the relative value, and the horizontal axis shows the distance. The light-emitting region is defined as a region directly above the light-emitting elements in the light-emitting module 100S.

Figure 15:
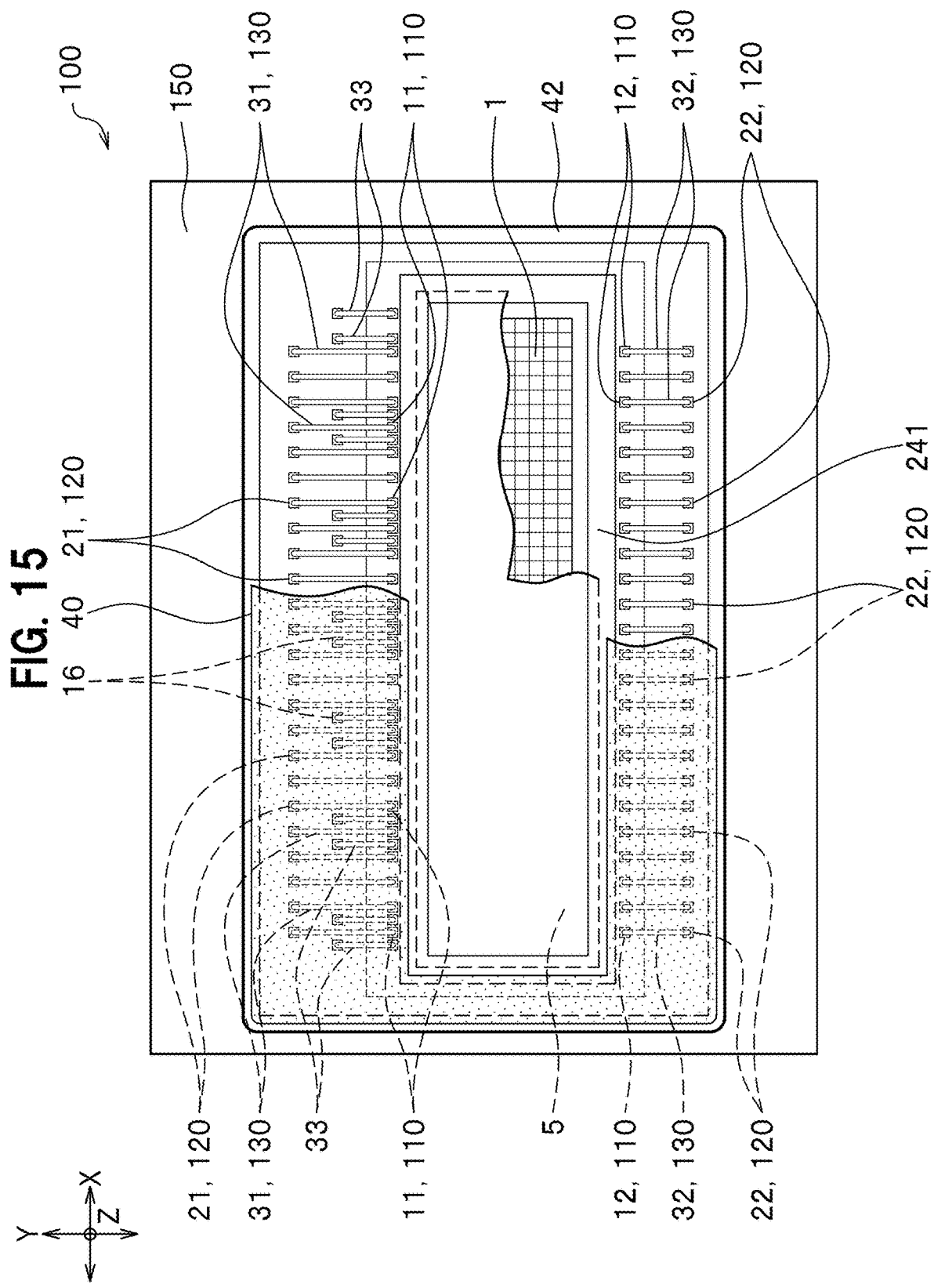
FIG. 15 is a schematic plan view of a light-emitting module used to provide experimental data.
Figure 16:
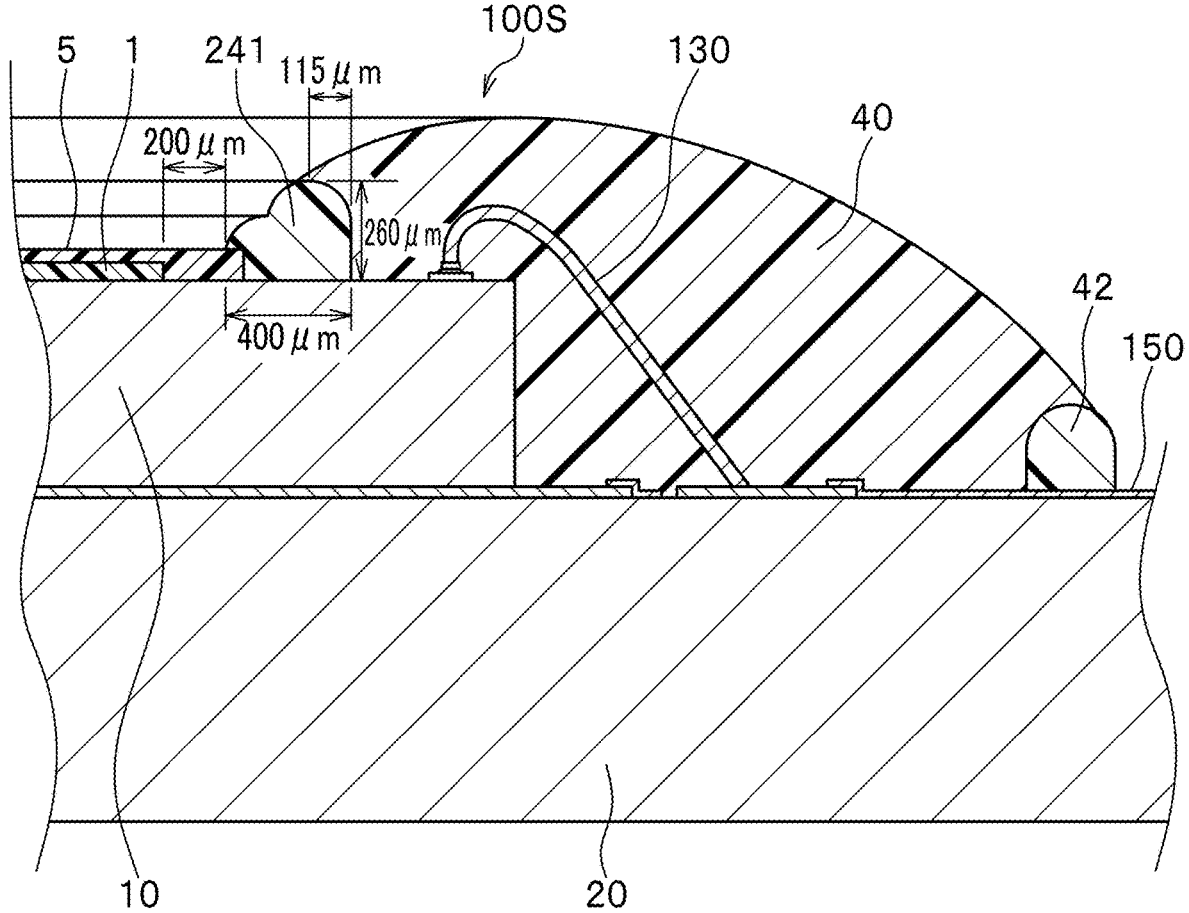
FIG. 16 is a schematic enlarged cross-sectional view of the vicinity of a first projection in FIG. 15.

The fundamental structure of the light-emitting module 100S is described below as shown in FIG. 15 and FIG. 16. The shape of the first projection 241 is as described above for the second variation, and a member constituting the first projection 241 and a member constituting the covering member 40 are provided as described in the conditions 1 to 5 below. Reference numerals in the structure shown in FIG. 15 and FIG. 16 are the same as the reference numerals in the structures described above, and the descriptions are omitted as appropriate.

Fundamental Structure of Example Light-emitting Module (1) The first substrate 10 is a silicon substrate with a built-in IC. The first substrate 10 has a rectangular shape having a size of 14.5 mm×5.39 mm in a plan view and a thickness of 0.615 mm.

(2) The light-emitting elements 1 each have a shape of an inverted cone or inverted pyramid, a rectangular upper surface measuring 45 µm×45 µm, and a thickness of 8.5 µm. The light-emitting element 1 is disposed on the first substrate 10 with Cu plating having a thickness of 3 µm disposed as an element bonding member therebetween. The light-reflective member is disposed between the light-emitting elements on the first substrate 10. The light-reflective member is constituted of a dimethyl silicone resin containing titanium oxide. The light-emitting elements 1 are disposed so that the distance between the light-emitting elements will be 50 µm. A total of 16,384 light-emitting elements 1 are disposed on the first substrate 10 in 64 rows×64 columns×4 segments.

(3) The second substrate 20 is a Cu-core substrate containing Cu inside the substrate, and wiring layers are disposed on the front and back surfaces. The second substrate 20 has a size of 20 mm×13 mm in a plan view and a thickness of 0.522 mm.

(4) The second substrate 20 and the first substrate 10 are bonded together with Ag paste containing a silicone resin.

(5) The first terminals disposed on the first substrate 10 are electrically connected to the second terminals disposed on the second substrate 20 via the wires 130. The wires 130 are made of Au and have a diameter of 45 µm.

(6) The sheet-shaped wavelength conversion member 5 having a rectangular shape measuring 13.7 mm×4.0 mm in a plan view and a thickness of 0.03 mm is disposed on the upper surfaces of the light-emitting elements 1. The wavelength conversion member 5 is constituted of a dimethyl silicone resin containing a YAG phosphor. The particle diameter of the YAG phosphor contained in the wavelength conversion member 5 is 10 µm or less.

(7) The covering member 40 disposed across the first substrate 10 and the second substrate 20 to cover the wires 130 contains a light-shielding filler in a dimethyl silicone resin serving as the base material as a common structure.

(8) The first projection 241 is disposed 200 µm apart from the light-emitting region. The first projection 241 is disposed on the first substrate 10 to cover the perimeter of the wavelength conversion member 5. The width of the first projection 241 (that is, the shortest distance from the end of the first projection 241 on the light-emitting element 1 side to the end on the side of the outer edge of the first substrate 10) is 400 and the height of the top portion of the first projection 241 from the first substrate 10 is 260 µm. The first projection 241 is formed such that the upper surface forms two continuous circular arcs in a cross-sectional view, and the top portion of the circular arc on the covering member 40 side is located above the circular top portion on the light-emitting element 1 side. In the first projection 241, the distance from the top portion (that is, the top portion of the circular arc located on the covering member 40 side) of the first projection 241 to the end on the covering member side is 115 µm.

The light-emitting modules 100S with the conditions 1 to 5 are formed with the above values serving as designed values, but the formed light-emitting modules 100S may have errors of about ±50 µm attributable to variation in members and mounting.

Structure of First Projection and Structure of Covering Member

The structures of the first projections 241 and the covering members 40 with the conditions 1 to 5 are as described below.

Condition 1

A black resin is used for the first projection 241 and the covering member 40. A commercially available dimethyl silicone resin containing carbon filler is used for the black resin.

Condition 2

A light-transmissive resin is used for the first projection 241. A dimethyl silicone resin is used for the light-transmissive resin. A white resin in which aluminum oxide serving as a reflective filler is mixed with a dimethyl silicone resin is used for the covering member 40. The aluminum oxide concentration in the white resin is about 13 mass %.

Condition 3

A light-transmissive resin is used for the first projection 241. A dimethyl silicone resin having a viscosity different from the viscosity in the condition 2 is used for the light-transmissive resin. A white resin with the same condition as the condition 2 is used for the covering member 40.

Condition 4

A white resin is used for the first projection 241. A white resin in which a hollow silica filler serving as a reflective filler is mixed with a dimethyl silicone resin is used for the white resin. The hollow silica filler concentration in the white resin is about 33 mass %. A white resin with the same condition as the condition 2 is used for the covering member 40.

Condition 5

A white resin is used for the first projection 241. A dimethyl silicone resin containing aluminum oxide as a reflective filler is used for the white resin. The aluminum oxide concentration in the white resin is about 13 mass %. A white resin with the same condition as the condition 2 is used for the covering member 40.

In the conditions 1 to 5, the viscosity and thixotropy of each resin are adjusted by adding a small amount of a silica-based nanofiller to the member described above as appropriate to provide desired shapes of the first projection 241 and the covering member 40.

Discussion on Conditions 1 to 5

At positions from the light-emitting region to the covering member beyond the first projection, the average luminance (cd/mm$^2$) of front light of the light-emitting module 100S is measured to check the state of generation of stray light (unnecessary reflection or scatter of light caused other than the light-emitting region) as shown in FIG. 17A and FIG. 17B. For FIG. 17A and FIG. 17B, the light-emitting region is represented by the region of 0 µm or more and 1,600 µm or less, the first projection is represented by the region of 1,800 µm or more and 2,200 µm or less, and the region in which the first projection is in contact with the covering member is represented by the region of 2,080 µm or more and 2,200 µm or less.

According to experimental data, a structure with the relative luminance value greatly decreasing from the outer edge of the light-emitting region and remaining low as the distance from the light-emitting region increases is preferable. Among structures having a peak of the relative luminance value in a region apart from the light-emitting region, a structure that shows a smaller maximum value of the peak is preferable. For example, when the peak of the relative luminance value observed at a position distant from the light-emitting region is about 2.2% or less, effects of stray light in an optical system unit including the light-emitting module as a light source are considered small.

The state of generation of stray light is examined with all the light-emitting elements mounted in the light-emitting module 100S being turn on. In FIG. 17A and FIG. 17B, the thick solid line indicates the condition 1, the dash-dot-dot line indicates the condition 2, the dotted line indicates the condition 3, the dot-dash line indicates the condition 4, and the thin solid line indicates the condition 5.

For the structure with the condition 5, a peak with a relative luminance value of more than 7% is observed at a position of the first projection apart from the light-emitting region.

On the other hand, for the structure with the condition 4, a peak with a relative luminance value of more than 4% is observed at the position of the first projection. For the structure with the condition 1, a peak with a relative luminance value of about 2.2% is observed at a position a little closer to the emission surface than the first projection.

For the structure with the condition 2, a weak peak with a relative luminance value of less than 2.2% is observed at a position outward of the position of the first projection (covering member side).

For the structure with the condition 3, a weak peak with a relative luminance value of about 2.2% is observed at a position outward of the first projection 241 (covering member side).

The results described above showed that use of a light-transmissive member for the first projection 241 as in the conditions 2 and 3 reduced the relative luminance value of generated stray light to a value about equal to the case of a black resin.

On the basis of the experimental data described above, the same is supposed to apply to the structures of the first projection 41 and the covering member 40 according to the first embodiment, and the light-transmissive first projection 41 is therefore considered to be able to reduce stray light (unintended scattered light) in the light-emitting module.

While the light-emitting module and the method of manufacturing the light-emitting module according to the present invention have been specifically described referring to the embodiment, the scope of the present invention is not limited by these descriptions and should be broadly interpreted on the basis of the claims. The scope of the present invention also encompasses various variations based on these descriptions.

The light-emitting module 100 according to embodiments of the present disclosure may be used for various light sources for vehicle headlights, projectors, and the like.

What is claimed is:

1. A light-emitting module comprising:
   a plurality of light-emitting elements;
   a first substrate having an upper surface that includes an element mounting region on which the plurality of light-emitting elements are mounted, the first substrate comprising a plurality of first terminals arranged along the element mounting region at locations outward of the element mounting region at the upper surface of the first substrate;
   a second substrate having an upper surface that includes a substrate mounting region on which the first substrate is mounted, the second substrate comprising a plurality of second terminals arranged along the substrate mounting region at locations outward of the substrate mounting region at the upper surface of the second substrate;
   a plurality of wires, each connected to a corresponding one of the first terminals and a corresponding one of the second terminals, the plurality of wires arranged along corresponding outer edges of the first substrate;
   a light-shielding covering member disposed outward of the element mounting region so as to cover the plurality of wires; and
   a light-transmissive first projection disposed along the element mounting region between the element mounting region and the first terminals so as to physically contact the light-shielding covering member, wherein an entirety of the light-transmissive first projection is located inward of the plurality of first terminals;
   wherein:
   a height of a top portion of the light-shielding covering member from the upper surface of the first substrate at a location outward of the light-transmissive first projection is greater than a height of the light-transmissive first projection from the upper surface of the first substrate.

2. The light-emitting module according to claim 1, further comprising a second projection disposed on the upper surface of the second substrate outward of the second terminals so as to physically contact the light-shielding covering member.

3. The light-emitting module according to claim 2,
   wherein the light-transmissive first projection surrounds the element mounting region in a plan view,
   wherein the second projection surrounds the first substrate in a plan view, and
   wherein the light-shielding covering member is disposed between the light-transmissive first projection and the second projection.

4. The light-emitting module according to claim 1,
   wherein the element mounting region has a rectangular shape having two sides opposite to each other in a plan view, and
   wherein the wires are disposed along each of the two opposite sides of the element mounting region.

5. The light-emitting module according to claim 1, further comprising:
   a wavelength conversion member covering the plurality of light-emitting elements,
   wherein, in a plan view, the plurality of light-emitting elements are located inward of an outer periphery of the wavelength conversion member.

6. The light-emitting module according to claim 1, wherein an interface between the light-transmissive first projection and the light-shielding covering member has a curved shape convex toward the light-shielding covering member.

7. The light-emitting module according to claim 1, wherein the light-shielding covering member comprises a first light-shielding covering member covering the wires and a second light-shielding covering member covering the first covering member.

8. The light-emitting module according to claim 7, wherein the first light-shielding covering member contains a light-absorbing substance.

9. The light-emitting module according to claim 7, wherein the second light-shielding covering member contains a light-reflective substance.

10. The light-emitting module according to claim 1, wherein the light-shielding covering member comprises a resin containing a light-shielding filler.

11. The light-emitting module according to claim 10, wherein the light-shielding filler comprises a light-absorbing substance.

12. The light-emitting module according to claim 11, wherein the light-absorbing substance comprises a at least one of pigments, carbon black, or graphite.

13. The light-emitting module according to claim 10, wherein the light-shielding filler comprises a light-reflective substance.

14. The light-emitting module according to claim 13, wherein the light-reflective substance comprises at least one of titanium oxide, aluminum oxide, zinc oxide, barium carbonate, barium sulfate, boron nitride, aluminum nitride, or glass filler.

15. The light-emitting module according to claim 1, further comprising a light-reflective member disposed on the first substrate so as to cover lateral surfaces of the light-emitting elements, wherein a portion of the light-reflective member is located between the light-emitting elements and the light-transmissive first projection.

16. The light-emitting module according to claim 1, wherein the light-transmissive first projection does not physically contact the light-emitting elements.

* * * * *